US012615856B2

(12) United States Patent
Okano

(10) Patent No.: US 12,615,856 B2
(45) Date of Patent: Apr. 28, 2026

(54) IMAGING ELEMENT AND SEMICONDUCTOR CHIP

(71) Applicant: SONY SEMICONDUCTOR SOLUTIONS CORPORATION, Kanagawa (JP)

(72) Inventor: Hitoshi Okano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 772 days.

(21) Appl. No.: 17/908,715

(22) PCT Filed: Mar. 5, 2021

(86) PCT No.: PCT/JP2021/008592
§ 371 (c)(1),
(2) Date: Sep. 1, 2022

(87) PCT Pub. No.: WO2021/187151
PCT Pub. Date: Sep. 23, 2021

(65) Prior Publication Data
US 2023/0163153 A1      May 25, 2023

(30) Foreign Application Priority Data
Mar. 19, 2020     (JP) ................................. 2020-049247

(51) Int. Cl.
*H01L 27/146*          (2006.01)
*H01L 21/02*          (2006.01)
(Continued)

(52) U.S. Cl.
CPC ........... *H10F 39/18* (2025.01); *H01L 21/022* (2013.01); *H10D 62/153* (2025.01);
(Continued)

(58) Field of Classification Search
CPC .... H10F 39/18; H10F 39/018; H10F 39/8053; H10F 39/8063; H10F 39/199;
(Continued)

(56) References Cited

U.S. PATENT DOCUMENTS

2020/0035735 A1 *    1/2020   Tsugawa ................. H01L 25/18

FOREIGN PATENT DOCUMENTS

JP          2006-202984        8/2006
JP          2009-088430        4/2009
(Continued)

OTHER PUBLICATIONS

International Search Report and Written Opinion prepared by the Japan Patent Office on May 27, 2021, for International Application No. PCT/JP2021/008592, 2 pgs.

*Primary Examiner* — Cuong B Nguyen
(74) *Attorney, Agent, or Firm* — Sheridan Ross P.C.

(57)          ABSTRACT

The present technology relates to an imaging element and a semiconductor chip that enable the imaging element to be shorter. A first chip including a photodiode, and a second chip including a circuit configured to process a signal from the photodiode are laminated, and an impurity layer is provided on a second surface opposite to a first surface of the second chip on which the first chip is laminated. The impurity layer is formed to have an impurity concentration higher than an impurity concentration of a semiconductor substrate constituting the second chip. In the present technology, for example, an imaging element that is configured by laminating a plurality of chips and is shorter and smaller can be applied.

15 Claims, 19 Drawing Sheets

(51) Int. Cl.
    H10D 62/13        (2025.01)
    H10D 84/90        (2025.01)
    H10F 39/18         (2025.01)

(52) U.S. Cl.
    CPC ......... H10D 62/157 (2025.01); H10D 84/907
               (2025.01); *H10D 84/937* (2025.01)

(58) Field of Classification Search
    CPC .. H10F 39/8037; H10F 39/809; H10F 39/811;
             H01L 21/022; H10D 62/153; H10D
           62/157; H10D 84/907; H10D 84/937;
                             H04N 25/70
    See application file for complete search history.

(56)                 References Cited

FOREIGN PATENT DOCUMENTS

| | | |
|---|---|---|
| JP | 2019-029583 | 2/2019 |
| WO | WO 2018/180570 | 10/2018 |

\* cited by examiner

501

330f

IMAGING ELEMENT AND SEMICONDUCTOR CHIP

CROSS REFERENCE TO RELATED APPLICATIONS

This application is a national stage application under 35 U.S.C. 371 and claims the benefit of PCT Application No. PCT/JP2021/008592, having an international filing date of 5 Mar. 2021, which designated the United States, which PCT application claimed the benefit of Japanese Patent Application No. 2020-049247, filed 19 Mar. 2020, the entire disclosures of each of which are incorporated herein by reference.

TECHNICAL FIELD

The present technology relates to an imaging element and a semiconductor chip, for example, to an imaging element and a semiconductor chip that can be shortened.

BACKGROUND ART

In the related art, in a device using a semiconductor substrate, a structure in which a plurality of semiconductor substrates are laminated for the purpose of curbing an increase in chip area, wiring resistance, power consumption, and the like has been proposed (see, for example, PTL 1).

A method of first laminating a plurality of semiconductor substrates in a wafer process, electrically connecting the semiconductor substrates, and then individualizing the semiconductor substrates into chip sizes is known as a scheme for laminating a plurality of semiconductor substrates. In fact, a CMOS image sensor configured of a logic board and a sensor board is produced by using the above-described method, and there is also a CMOS image sensor in which three or more semiconductor substrates are laminated.

CITATION LIST

Patent Literature

[PTL 1]
    JP 2009-88430 A

SUMMARY

Technical Problem

Incidentally, when a plurality of semiconductor substrates are laminated to form a semiconductor device, it is desired to reduce a total thickness. It is desired to realize a thinner, shorter, and smaller semiconductor substrate by reducing a total thickness.

The present technology has been made in view of such a situation, and is intended to make a semiconductor substrate thinner, shorter, and smaller.

Solution to Problem

A first imaging element of an aspect of the present technology includes: a first chip including a photodiode; and a second chip including a circuit configured to process a signal from the photodiode, the first and second chips being laminated, and an impurity layer is provided on a second surface opposite to a first surface of the second chip on which the first chip is laminated.

A semiconductor chip of an aspect of the present technology is a chip with a thickness of 20 μm or less, including: an impurity layer provided on a predetermined surface of the chip.

A second imaging element of an aspect of the present technology includes: a first chip including a photodiode; a second chip including a circuit configured to process a signal from the photodiode; and a third chip having a memory function or an AI function, the first to third chips being laminated, and an impurity layer is provided on a second surface opposite to a first surface of the third chip on which the second chip is laminated.

In the first imaging element of the aspect of the present technology, the first chip including a photodiode and the second chip including the circuit configured to process the signal from the photodiode are laminated, and the impurity layer is provided on the second surface opposite to the first surface of the second chip on which the first chip is laminated.

The semiconductor chip of the aspect of the present technology is the semiconductor chip with a thickness of 20 μm or less, and the impurity layer is provided on a predetermined surface of the chip.

In the second imaging element of the aspect of the present technology, the first chip including a photodiode, the second chip including the circuit configured to process the signal from the photodiode, and the third chip having a memory function or an AI function are laminated, and the impurity layer is provided on the second surface opposite to the first surface of the third chip on which the second chip is laminated.

DESCRIPTION OF EMBODIMENTS

Hereinafter, a mode for implementing the present technology (hereinafter referred to as an embodiment) will be described.

The present technology can be applied to an imaging device, and therefore a case in which the present technology is applied to an imaging device will be described herein by way of example. Although description of a case of an imaging device will proceed as an example herein, the present technology is not limited to application to an imaging device, and can be applied to all electronic devices in which an imaging device is used for an image capture unit (a photoelectric conversion unit), such as an imaging device such as a digital still camera or a video camera, a mobile terminal device having an imaging function such as a mobile phone, and a copier in which an imaging device is used for an image reading unit. A form of a module type mounted in an electronic device, that is, a camera module, may be used as an imaging device.

Figure 1:
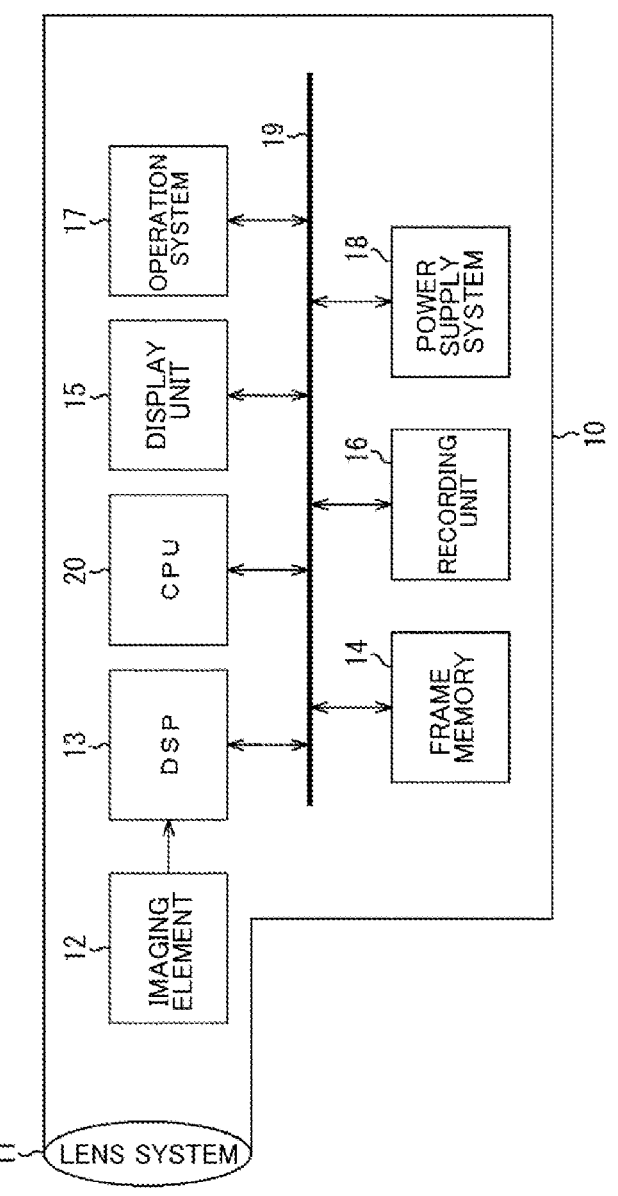
FIG. 1 is a diagram illustrating a configuration example of an imaging device.

FIG. 1 is a block diagram illustrating a configuration example of an imaging device that is an example of an electronic device of the present disclosure. As illustrated in FIG. 1, the imaging device 10 includes an optical system including a lens group 11 and the like, an imaging element 12, a DSP circuit 13 which is a camera signal processing unit, a frame memory 14, a display unit 15, a recording unit 16, an operation system 17, a power supply system 18, and the like.

The DSP circuit 13, the frame memory 14, the display unit 15, the recording unit 16, the operation system 17, and the power supply system 18 are connected to each other via a bus line 19. A CPU 20 controls the respective units in the imaging device 10.

The lens group 11 captures incident light (image light) from a subject and forms an image on an imaging surface of the imaging element 12. The imaging element 12 converts an amount of incident light imaged on the imaging surface by the lens group 11 into an electrical signal on a pixel-by-pixel basis and outputs the electrical signal as a pixel signal. As the imaging element 12, it is possible to use an imaging element (image sensor) including pixels to be described below.

The display unit 15 includes a panel-type display unit such as a liquid crystal display unit or an organic electro luminescence (EL) display unit, and displays a moving image or a still image captured by the imaging element 12. The recording unit 16 records the moving image or the still image captured by the imaging element 12 on a recording medium such as a video tape or a digital versatile disk (DVD).

The operation system 17 generates operation commands for various functions of the present imaging device under an operation of a user. The power supply system 18 appropriately supplies various power sources that serve as operating power sources for the DSP circuit 13, the frame memory 14, the display unit 15, the recording unit 16, and the operation system 17 to these supply targets.

<Configuration of Imaging Element>

Figure 2:
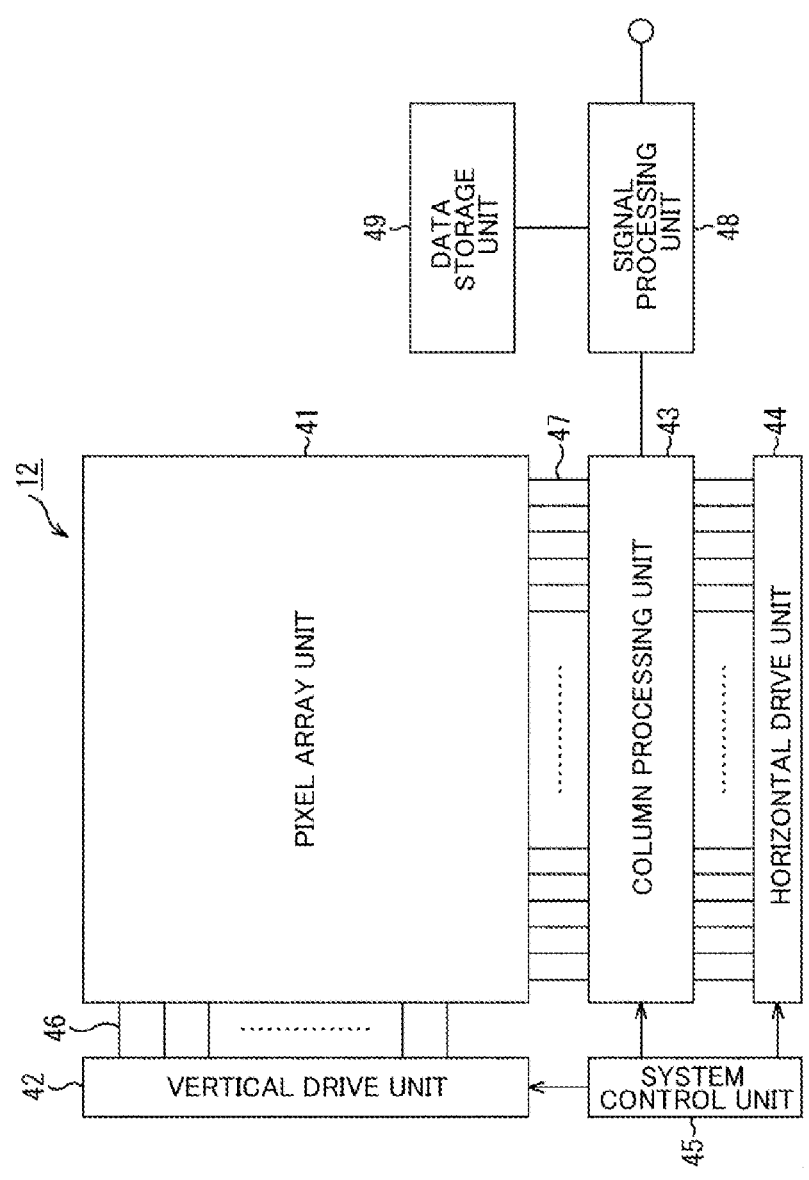
FIG. 2 is a diagram illustrating a configuration example of an imaging element.

FIG. 2 is a block diagram illustrating a configuration example of the imaging element 12. The imaging element 12 can be a complementary metal oxide semiconductor (CMOS) image sensor.

The imaging element 12 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) (not illustrated).

In the pixel array unit 41, unit pixels having a photoelectric conversion element that generates an photocharge of a charge amount according to the amount of incident light and accumulates the amount of light charge therein are two-dimensionally disposed in a matrix form. Hereinafter, the photocharge of a charge amount according to the amount of incident light may be simply referred to as a "charge" and the unit pixel may be simply referred to as a "pixel."

In the pixel array unit 41, a pixel drive line 46 is also formed in each row in a horizontal direction in FIG. 2 (an arrangement direction of the pixels in the pixel row) in a pixel arrangement in a matrix and a vertical signal line 47 is formed in each column in a vertical direction in FIG. 2 (an arrangement direction of pixels in a pixel column). One end of the pixel drive line 46 is connected to an output terminal of the vertical drive unit 42 corresponding to each row.

The imaging element 12 further includes a signal processing unit 48 and a data storage unit 49. The signal processing unit 48 and the data storage unit 49 may be processed by an external signal processing unit provided on a substrate separate from the imaging element 12, such as a digital signal processor (DSP) or software, or may be mounted on the same substrate as the imaging element 12.

The vertical drive unit 42 is a pixel drive unit that includes a shift register, an address decoder, and the like and drives all the respective pixels of the pixel array unit 41 simultaneously or in units of rows. Although a specific configuration of the vertical drive unit 42 is not specifically illustrated in the drawings, the vertical drive unit 42 includes a readout scanning system, and a sweep scanning system, or is configured to have batch sweep and batch transfer.

The readout scanning system sequentially selectively scans the unit pixels of the pixel array unit 41 in units of rows in order to read out signals from the unit pixels. In the case of row driving (a rolling shutter operation), for sweep, sweep scanning is performed at a time prior to readout scanning according to a shutter speed on a readout row on which the readout scanning is performed by the readout scanning system. In the case of global exposure (a global shutter operation), batch sweep is performed at a time prior to batch transfer according to the shutter speed.

Unnecessary charge is swept (reset) from the photoelectric conversion elements of the unit pixels on the readout row by this sweep. A so-called electronic shutter operation is performed by sweeping (resetting) the unnecessary charge. Here, the electronic shutter operation is an operation of discarding the photocharge of the photoelectric conversion element and newly starting exposure (starting accumulation of photocharge).

A signal read out by a readout operation of the readout scanning system corresponds to an amount of light that has been incident after an immediately previous readout operation or electronic shutter operation. In the case of the row driving, a period from a readout timing in the immediately previous readout operation or a sweep timing in the electronic shutter operation to a readout timing in a current readout operation is a photocharge accumulation period (an exposure period) in the unit pixel. In the case of the global exposure, a period from batch sweep to batch transfer is an accumulation period (an exposure period).

A pixel signal output from each unit pixel of the pixel row selectively scanned by the vertical drive unit 42 is supplied to the column processing unit 43 through each vertical signal line 47. The column processing unit 43 performs predetermined signal processing on the pixel signal output from each unit pixel of the selected row through the vertical signal line 47 for each pixel column of the pixel array unit 41, and temporarily holds the pixel signal after the signal processing.

Specifically, the column processing unit 43 performs at least a noise removal processing such as correlated double sampling (CDS) processing as signal processing. Fixed pattern noise specific to a pixel, such as reset noise or a variation in a threshold value of an amplification transistor, is removed by the correlated double sampling in the column processing unit 43. The column processing unit 43 can have, for example, an analog-to-digital (AD) conversion function to output a signal level as a digital signal, in addition to the noise removal processing.

The horizontal drive unit 44 includes a shift register, an address decoder, and the like, and sequentially selects unit circuits corresponding to the pixel columns of the column processing unit 43. The pixel signals subjected to the signal processing by the column processing unit 43 are sequentially output to the signal processing unit 48 by the selective scanning of the horizontal drive unit 44.

The system control unit 45 includes, for example, a timing generator that generates various timing signals, and performs control of driving of the vertical drive unit 42, the column processing unit 43, the horizontal drive unit 44, and the like on the basis of the various timing signals generated by the timing generator.

The signal processing unit 48 has at least an addition processing function and performs various types of signal processing such as addition processing on the pixel signals output from the column processing unit 43. The data storage unit 49 temporarily stores data required for the signal processing in the signal processing unit 48.

First Embodiment

Figure 3:
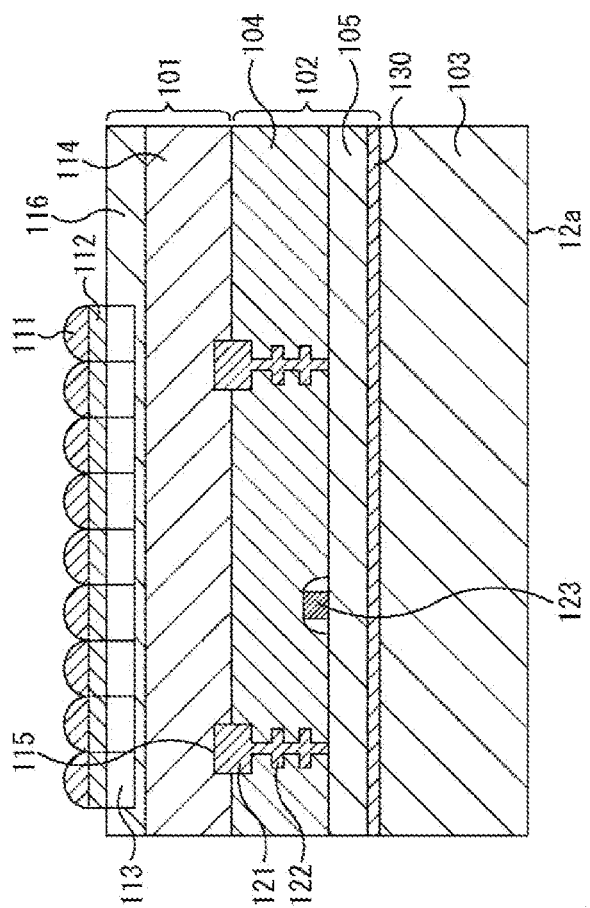
FIG. 3 is a cross-sectional view of a first embodiment of an imaging element to which the present technology is applied.

FIG. 3 illustrates an example of a cross-sectional configuration of the imaging element 12 in a first embodiment (referred to as an imaging element 12a). The imaging element 12a has a configuration in which a CMOS image sensor (CIS) chip 101, a logic chip 102, and a support base 103 are laminated in that order from the top of FIG. 3. The upper side in FIG. 3 is the light incidence surface side, and the CIS chip 101 is laminated on the light incidence surface side.

The CIS chip 101 is, for example, a chip including the pixel array unit 41 illustrated in FIG. 2. The CIS chip 101 is configured of a photodiode layer 116 in which a plurality of photodiodes 113 formed on a silicon substrate are formed, and a wiring layer 114. Further, an on-chip lens 111 and a color filter 112 are laminated on the light incidence surface side of the CIS chip 101.

A logic circuit, a memory, and the like are formed in the logic chip 102. The logic circuit is, for example, the system control unit 45 or the signal processing unit 48 (FIG. 2). The logic chip 102 and the CIS chip 101 are connected by pads formed in the respective chips. For example, in the logic chip 102, a pad 121 is formed on the side on which the CIS chip 101 is laminated. Further, in the CIS chip 101, a pad 115 is formed on the side on which the logic chip 102 is laminated.

Each of the pad 115 and the pad 121 is formed of a conductor such as copper (Cu). The pad 115 is electrically connected to a predetermined portion of the circuit formed in the CIS chip 101, such as a wiring for reading a signal from a photodiode 113. Further, the pad 121 is electrically connected to a logic circuit formed in the logic chip 102.

Further, the pad 115 and the pad 121 corresponding to each other are formed at positions in contact with each other in a state in which the CIS chip 101 and the logic chip 102 are laminated as illustrated in FIG. 3. That is, the circuit formed in the CIS chip 101 and the circuit formed in the logic chip 102 are electrically connected to each other via the pad 115 and the pad 121.

The number of pads 115 and pads 121 formed in the imaging element 12a is arbitrary.

As illustrated in FIG. 3, a wiring 122, a transistor 123, and the like are formed in the logic chip 102. In the logic chip 102, for example, a multi-layer wiring layer 104 is formed on the upper side (CIS chip 101 side) of a silicon substrate 105 made of silicon (Si). In the multi-layer wiring layer 104, the system control unit 45, the signal processing unit 48, and the like illustrated in FIG. 2 are configured. A plurality of wiring layers are formed in the multi-layer wiring layer 104, and an interlayer insulating film is formed between the wiring layers.

The pad 121 is connected to the wiring 122. Further, the pad 121 and the wiring 122 formed in the predetermined wiring layer are connected by a via formed in a vertical direction. Although (a gate of) one transistor 123 is illustrated in FIG. 3, a plurality of transistors are formed.

In the logic chip 102, a high-concentration impurity layer 130 is formed on the side on which the support base 103 is laminated, in other words, on a surface opposite to a surface on which the CIS chip 101 is laminated (the silicon substrate 105 side). The high-concentration impurity layer 130 is a layer having a high P-type or N-type impurity concentration, which will be described in detail below.

In the first embodiment, an example in which the high-concentration impurity layer 130 is formed only on one surface (back surface) of the silicon substrate 105 of the logic chip 102 will be shown and described, but the high-concentration impurity layer 130 may be formed on a side surface of the logic chip 102.

The high-concentration impurity layer 130 is provided to prevent an adverse effect due to defects formed, for example, when the logic chip 102 is thinned at the time of manufacture of the logic chip 102. This will be described with reference to FIG. 4.

Figure 4:
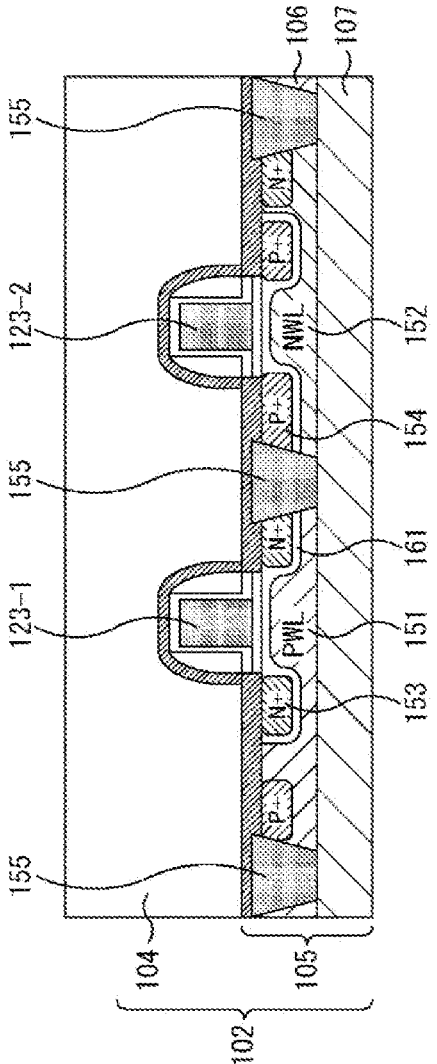
FIG. 4 is a diagram illustrating a layer on which transistors are formed.
Figure 5:
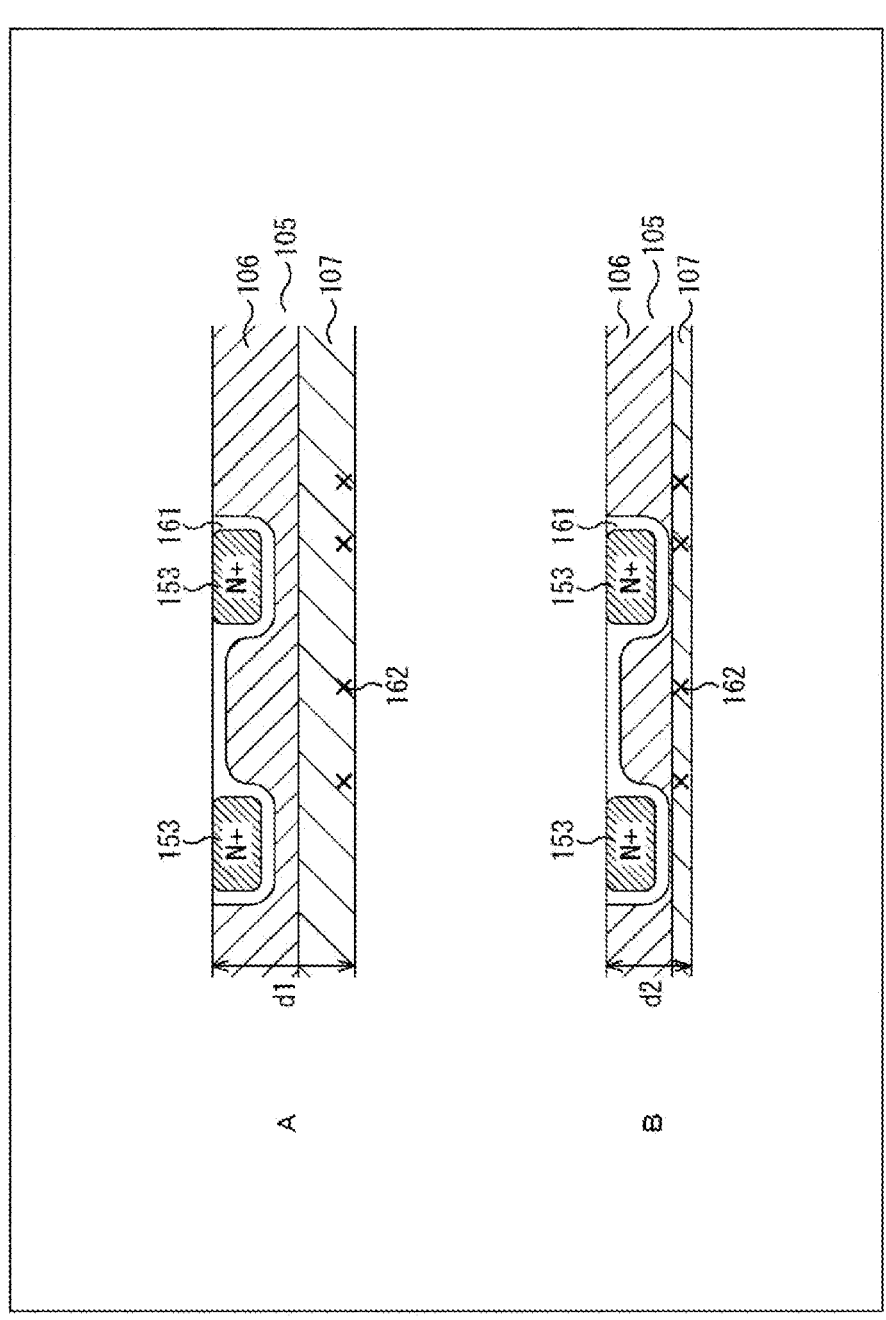
FIG. 5 is a diagram illustrating occurrence of a leakage due to defects.

FIG. 4 is an enlarged view of a region in which the transistor 123 is formed. In FIG. 4, in the logic chip 102, a region in which a gate portion of the transistor 123 is formed is a gate formation layer 104, and a region in which a source and a drain of the transistor 123 are formed is a source and drain formation layer 106. In FIGS. 4 and 5, the multi-layer wiring layer 104 is referred to as the gate formation layer 104. Further, the silicon substrate 105 is a P-type substrate 107, and a region in which a source or a drain is formed in the P-type substrate 107 is described as the source and drain formation layer 106.

An N-type transistor 123-1 and a P-type transistor 123-2 are formed in the logic chip 102. A P-well 151 and an N-well 152 are formed on the source and drain formation layer 106. The N-type transistor 123-1 is formed in the P-well 151, and the P-type transistor 123-2 is formed in the N-well 152.

An N+ region 153 is formed in the source and drain formation layer 106. The N+ region 153 is formed on the left and right sides of (the gate of) the N-type transistor 123-1, one thereof functions as a source and the other functions as a drain. Further, a P+ region 154 is formed in the source and drain formation layer 106. The P+ region 154 is formed on the left and right sides of (the gate of) the P-type transistor 123-2, one thereof functions as a source and the other functions as a drain.

Further, an element separation region 155 is formed in the source and drain formation layer 106. As illustrated in FIG. 4, the element separation region 155 is formed to penetrate the source and drain formation layer 106, which is a semiconductor layer on which a transistor (for example, the N-type transistor 123-1 or the P-type transistor 123-2) is formed. The element separation region 155 is configured of an arbitrary insulator.

A depletion layer is formed at a PN junction portion of a semiconductor. For example, a depletion layer 161 is formed in a portion in which the P-well 151 and the N+ region 153 are in contact with each other and a portion in which the N-well 152 and the P+ region 154 are in contact with each other.

When the depletion layer 161 spreads to the vicinity of defects formed in the source and drain formation layer 106 or spreads to a position in contact with the defects, a leakage current is likely to flow from the depletion layer 161 to the defects and from the defects to the depletion layer 161. This will be described with reference to FIG. 5.

FIG. 5 is an enlarged view of a portion of the silicon substrate 105. Further, FIG. 5 illustrates a case in which thicknesses of the logic chips 102 (thicknesses of the silicon substrates 105) differ, and illustrates a case in which the thickness of the silicon substrate 105 illustrated in B of FIG. 5 is smaller than that of the silicon substrate 105 illustrated in A of FIG. 5.

A of FIG. 5 will be referred to. A case in which the silicon substrate 105 illustrated in A of FIG. 5 is thinned until the silicon substrate 105 has a thickness d1 is shown. For example, when the thickness d1 is a thickness at which a state in which, for example, the N+ region 153 (depletion layer 161) and the defects 162 formed on the silicon substrate 105 are sufficiently separated from each other can be secured, it is possible to prevent leakage from occurring between the depletion layer 161 and the defects 162 via the defects 162.

A case in which the logic chip 102 illustrated in B of FIG. 5 has been thinned until the source and drain formation layer 106 reaches a thickness d2 is shown. The thickness d2 is a thickness that satisfies thickness d1>thickness d2. For example, when the thickness d2 is a thickness at which a state in which, for example, the N+ region 153 (the depletion layer 161) formed in the source and drain formation layer 106 and the defects 162 are sufficiently separated from each other cannot be secured, leakage is likely to occur between the depletion layer 161 and the defects 162 via the defects 162.

For example, the defects 162 may be formed in a process of thinning the logic chip 102 at the time of manufacturing. Further, when the logic chip 102 is thinned to a thickness such as the thickness d2, the leakage is likely to increase via the defects 162, as described above. When an increase in such leakage occurs, the logic chip will be treated as a defective product at the time of manufacturing.

Therefore, the logic chip 102 needs to have a certain thickness. However, when the logic chip 102 can be formed to be thin, it is possible to decrease the length and size of the imaging element 12.

Therefore, the high-concentration impurity layer 130 is formed in the logic chip 102, as described with reference to FIG. 3. The high-concentration impurity layer 130 is formed as an impurity layer having the same carrier type as the silicon substrate 105 (the P-type substrate 107).

Here, because the silicon substrate 105 is described through an example of the P-type substrate 107 containing P-type impurities, the high-concentration impurity layer 130 is formed as a layer containing P-type impurities having a higher concentration than the P-type substrate 107.

When the silicon substrate 105 is an N-type substrate containing N-type impurities, the high-concentration impurity layer 130 is formed as a layer containing N-type impurities having a higher concentration than the silicon substrate 105 (N-type substrate). In the following description, a case in which the silicon substrate 105 is a P-type substrate 107 and the high-concentration impurity layer 130 is a P-type impurity layer will be described by way of example.

The high-concentration impurity layer 130 will be described, and the high concentration means that an impurity concentration is at least higher than that of the silicon substrate 105 (the P-type substrate 107). In other words, a layer having an impurity concentration higher than that of the silicon substrate 105 may be formed in a chip such as the logic chip 102.

Providing the high-concentration impurity layer 130 makes it possible to prevent the depletion layer 161 from spreading from, for example, the N+ region 153 in the silicon substrate 105. Further, providing the high-concentration impurity layer 130 makes it possible to block the spread of the depletion layer 161 spreading from, for example, the N+ region 153 in the silicon substrate 105 using the high-concentration impurity layer 130 itself. Forming such a high-concentration impurity layer 130 on the silicon substrate 105 makes it possible to curb an increase in leakage between the wells via the defects 162.

Providing the high-concentration impurity layer 130 makes it possible to curb the occurrence (increase) of leakage between the wells via the defects 162 even when the logic chip 102 is formed to a small thickness. Therefore, even when a thickness of the logic chip 102 is formed to be small, it is possible to reduce a possibility of the logic chip 102 becoming a defective product. Therefore, it is possible to thinly form the logic chip 102, and to make the imaging element 12a including such a logic chip 102 shorter and smaller.

For example, a thickness of the silicon substrate 105 of the logic chip 102 can be formed to be 20 μm or less. According to the present technology, it is possible to prevent leakage from occurring (increasing) even when the thickness of the silicon substrate 105 is formed to be 20 μm or less.

It is possible to make the thickness of the silicon substrate 105 smaller than a depth that is a sum of a depth of the impurity layer (for example, the N+ region 153) present in the source and drain formation layer 106 of the silicon substrate 105 and a width of the depletion layer 161 spreading from the impurity layer.

Figure 6:
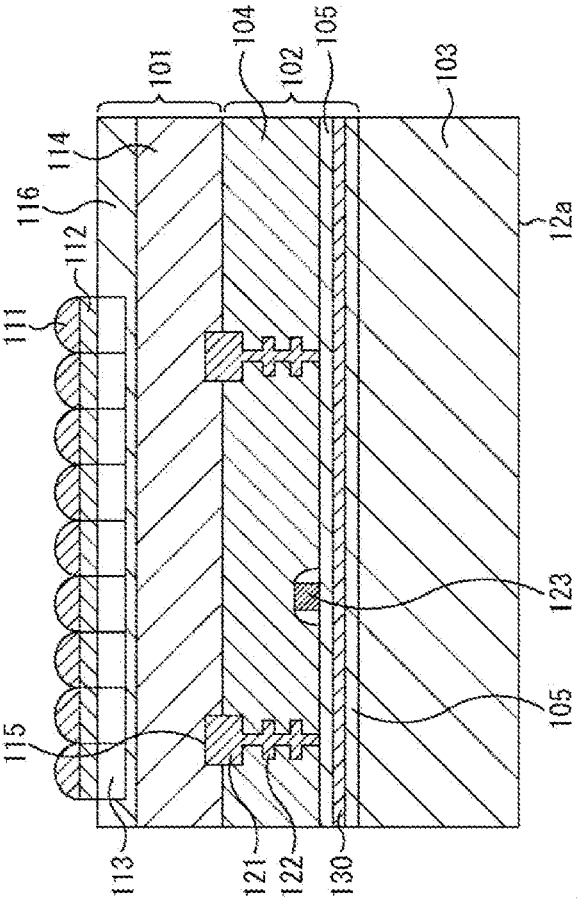
FIG. 6 is a diagram illustrating a case in which a high-concentration impurity layer is formed in the middle of a substrate.

The high-concentration impurity layer 130 may be formed on the back surface side of the silicon substrate 105 of the logic chip 102 as illustrated in FIG. 3, or may be formed at a position away from a back surface of the silicon substrate 105 as illustrated in FIG. 6. In the logic chip 102 of the imaging element 12a illustrated in FIG. 6, the high-concentration impurity layer 130 is formed in the middle of the silicon substrate 105 of the logic chip 102.

For example, when a thickness from a back surface to a front surface of the silicon substrate 105 is 100% and a thickness from the back surface side is 0%, the high-concentration impurity layer 130 can be formed, for example, in a range of 0 to 50%.

As illustrated in FIG. 3, the high-concentration impurity layer 130 may be formed with a predetermined thickness and a concentration of impurities on the back surface side of the logic chip 102 (the back surface side of the silicon substrate 105), which is the surface side on which the support base 103 is laminated. Further, as illustrated in FIG. 6, the high-concentration impurity layer 130 may be formed with a predetermined thickness and a concentration of impurities at a position away from the back surface side of the silicon substrate 105 of the logic chip 102, which is a position close to the transistor 123 (multi-layer wiring layer 104) side.

A position at which the high-concentration impurity layer 130 is formed in the silicon substrate 105 may be a position between a position not overlapping with the N+ region 153 or the P+ region 154 (hereinafter the description will be continued using the N+ region 153 as an example) and the back surface of the silicon substrate 105. Further, the high-concentration impurity layer 130 may be formed at a position overlapping a part of the depletion layer 161 or may be formed at a position away from the depletion layer 161.

Further, an impurity concentration when the high-concentration impurity layer 130 is formed at a position close to the N+ region 153 side may be lower than an impurity concentration when the high-concentration impurity layer 130 is formed at a position farther than the N+ region 153.

Generally, for example, when the impurity concentration of the N+ region 153 is high, or when an impurity concentration of a P-well region 151 in contact with the N+ region 153 is high, the spread of the depletion layer 161 (hereinafter appropriately referred to as a depletion layer width) increases. Therefore, in order to prevent the spread of the depletion layer 161 and curb the leakage between the wells through the defects 162, a position at which the high-concentration impurity layer 130 is formed or the impurity concentration is set in consideration of the concentration of the N+ region 153 and the high-concentration impurity layer 130 is formed.

Because the spread of the depletion layer 161 increases when an impurity concentration in the N+ region 153 is high, it is possible to prevent the depletion layer 161 from expanding using the high-concentration impurity layer 130 by forming the high-concentration impurity layer 130, for example, in the middle of the silicon substrate 105 as illustrated in FIG. 6, and to prevent leakage through the defects 162 formed on the back surface side of the silicon substrate 105 from occurring.

In this case, an impurity concentration of the high-concentration impurity layer 130 is set to be equal to or lower than a concentration at which the high-concentration impurity layer 130 does not influence the transistor 123. When the impurity concentration of the high-concentration impurity layer 130 is made high, the influence of the high-concentration impurity layer 130 may extend to a region of the N+ region 153 and performance of the transistor 123 is likely to deteriorate. The impurity concentration of the high-concentration impurity layer 130 is set to an impurity concentration that does not cause such a situation.

Because the spread of the depletion layer 161 increases when the impurity concentration in the N+ region 153 is high, it is possible to prevent a region with the defects 152 from depleting by forming the high-concentration impurity layer 130 near the back surface of the silicon substrate 105 as illustrated in FIG. 3, and to prevent leakage through the defects 162 formed on the back surface side of the silicon substrate 105 (in other words, the defects 162 formed near the high-concentration impurity layer 130) from occurring.

Also in this case, the impurity concentration of the high-concentration impurity layer 130 is set to be equal to or lower than a concentration at which the high-concentration impurity layer 130 does not influence the transistor 123.

Even in a case in which the impurity concentration of the N+ region 153 is low, it is possible to curb the occurrence of the leakage by appropriately setting the impurity concentration according to a position of the high-concentration impurity layer 130 in the silicon substrate 105, as in the case in which the impurity concentration of the N+ region 153 is high. In other words, it is possible to curb the occurrence of the leakage by appropriately setting the position of the high-concentration impurity layer 130 in the silicon substrate 105 according to the impurity concentration.

An example of specific numerical values will be described. When an impurity concentration of the silicon substrate 105 (the P-type substrate 107) (FIG. 4) is 1E13 to E14/cm$^3$ and the silicon substrate 105 is thinly polished to a thickness of 10 μm or less, the high-concentration impurity layer 130 having a concentration of about 1E16/cm$^3$, which is higher than a substrate concentration thereof (a concentration of the P-type substrate 107), is formed on the back surface of the silicon substrate 105.

It is possible to curb the occurrence of the leakage between the wells via the defects 162 generated at the time of polishing even when the silicon substrate 105 is thinly formed, by adopting a configuration in which the high-concentration impurity layer 130 having an impurity concentration higher than that of the silicon substrate 105 is included on the back surface (a surface on the side that is polished) of the silicon substrate 105. Therefore, according to the present technology, it is possible to configure the thin silicon substrate 105.

A specific numerical value regarding the thinness of the silicon substrate 105 can be set to, for example, 1 to 20 μm by applying the present technology. According to the present technology, it is possible to prevent leakage from occurring even when the silicon substrate 105 is formed to have a thickness of 1 to 20 μm.

The position at which the high-concentration impurity layer 130 is formed, the impurity concentration, or the like described here can be similarly applied to the following embodiments.

The high-concentration impurity layer 130 can be formed by polishing the logic chip 102 at the time of manufacturing the logic chip 102 and then injecting a Group 2 element with high energy from the polished surface side or from a surface opposite to the polished surface.

Further, it is possible to form the high-concentration impurity layer 130 by polishing the logic chip 102 and then injecting the Group 2 element with low energy from the polished surface side.

Further, the high-concentration impurity layer 130 may be formed by plasma doping. Further, the high-concentration impurity layer 130 may be formed by solid phase diffusion. When the high-concentration impurity layer 130 is formed as a layer of P-type impurities by the solid phase diffusion, it is possible to form the high-concentration impurity layer 130 that shakes a predetermined thickness, by forming a film of P-type impurities, for example, by doping with P-type impurities and then heating the film to diffuse the P-type impurities.

Further, the high-concentration impurity layer 130 may be formed by polishing the logic chip 102 and then applying a material containing P-type impurities to the polished surface.

According to such formation, it is possible to form the high-concentration impurity layer 130 without affecting characteristics of the chip (device). Therefore, it is possible to obtain the above-described effects while maintaining the characteristics of the chip (device) even when the high-concentration impurity layer 130 is formed.

Second Embodiment

Figure 7:
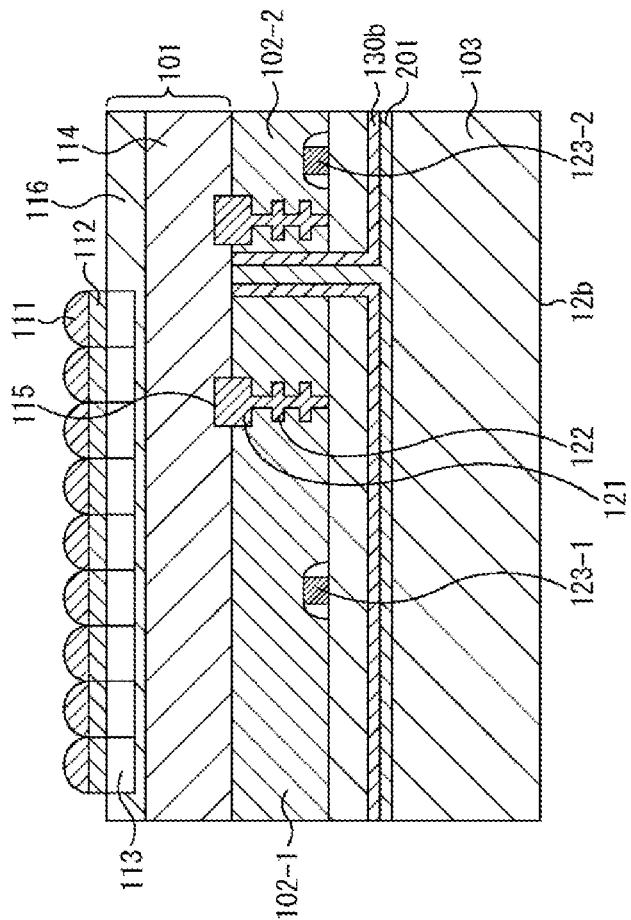
FIG. 7 is a diagram illustrating a cross-sectional configuration example of an imaging element in a second embodiment.

FIG. 7 illustrates an example of a cross-sectional configuration of the imaging element 12 in a second embodiment (referred to as an imaging element 12b).

The imaging element 12b in the second embodiment differs from the imaging element 12a in the first embodiment in that two logic chips 102 are laminated (disposed), and is basically the same as the imaging element 12a in other points. Hereinafter, description of the same parts will be omitted appropriately.

In the imaging element 12b according to the second embodiment, a logic chip 102-1 and a logic chip 102-2 are laminated (disposed) with respect to one CIS chip 101. Here, although the logic chip 102-1 and the logic chip 102-2 are described, any of the chips may be a chip on which a circuit other than a logic circuit such as a memory is formed.

Further, although an example in which two chips including the logic chip 102-1 and the logic chip 102-2 are laminated on one CIS chip 101 has been illustrated in FIG. 7, two or more logic chips 102 may be laminated.

When the two logic chips 102-1 and the logic chip 102-2 are disposed with respect to one CIS chip 101 as in the imaging element 12 illustrated in FIG. 7, a gap is created between the logic chip 102-1 and the logic chip 102-2. An oxide film 201 is formed in this gap.

A space around the logic chip 102-1 and the logic chip 102-2 is filled with the oxide film 201. Accordingly, the logic chip 102-1 and the logic chip 102-2 are in a state of being embedded in the oxide film 201.

Further, a high-concentration impurity layer 130b is also formed (laminated) on each of the logic chip 102-1 and the logic chip 102-2. The high-concentration impurity layer 130b is also formed in a portion of a gap between the logic chip 102-1 and the logic chip 102-2. The high-concentration impurity layer 130b is formed on a surface (back surface) of each of the logic chip 102-1 and the logic chip 102-2 that is not the surface on which the CIS chip 101 is laminated, as in the imaging element 12a of the first embodiment, and is also formed on a side surface of each of the logic chip 102-1 and the logic chip 102-2.

As illustrated in FIG. 7, the high-concentration impurity layer 130b is formed on the side surface and the back surface of the logic chip 102-1, and the oxide film 201 is laminated on the high-concentration impurity layer 130b. Similarly, the high-concentration impurity layer 130b is formed on a side surface and the back surface of the logic chip 102-2, and the oxide film 201 is laminated on the high-concentration impurity layer 130b.

Thus, the high-concentration impurity layer 130b may be also formed on the side surface of the logic chip 102.

Also in the imaging element 12b according to the second embodiment, it is possible to curb an increase in leakage between the wells through defects formed near an interface even when the thickness of the logic chip 102 is reduced, by forming the high-concentration impurity layer 130b.

Figure 8:
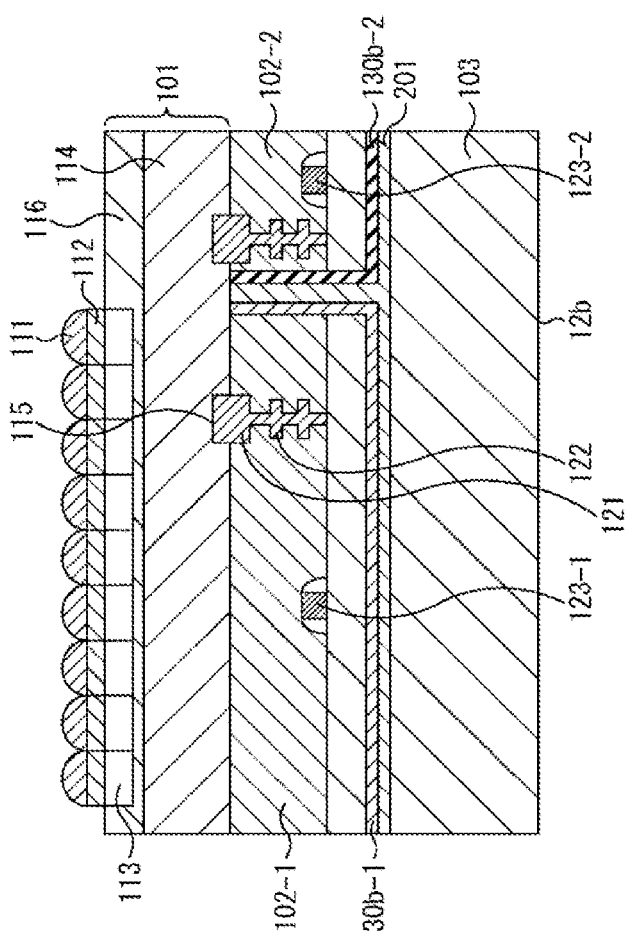
FIG. 8 is a diagram illustrating a cross-sectional configuration example of the imaging element according to a second embodiment.

As illustrated in FIG. 8, a high-concentration impurity layer 130b-1 formed in the logic chip 102-1 and a high-concentration impurity layer 130b-2 formed in the logic chip 102-2 may be formed with different impurity concentrations. For example, the high-concentration impurity layer 130b-1 may be formed to have an impurity concentration higher or lower than the impurity concentration of the high-concentration impurity layer 130b-2.

Although not illustrated in FIG. 8, the high-concentration impurity layer 130b-1 and the high-concentration impurity layer 130b-2 may not be formed at the same position. For example, the logic chip 102-1 and the logic chip 102-2 may be configured with different thicknesses, and the high-concentration impurity layer 130b-1 and the high-concentration impurity layer 130b-2 may be formed at different positions by the logic chip 102-1 and the logic chip 102-2 being configured with different thicknesses.

Further, for example, the high-concentration impurity layer 130b-1 and the high-concentration impurity layer 130b-2 may be configured not to be formed at the same position, and for example, the high-concentration impurity layer 130b-1 is formed on the back surface side of the logic chip 102-1 as illustrated in FIG. 3, and the high-concentration impurity layer 130b-2 is formed in the middle of the silicon substrate 105 of the logic chip 102-2 as illustrated in FIG. 6.

Further, for example, the logic chip 102-1 may be configured of a P-type substrate, and the logic chip 102-2 may be configured of an N-type substrate, and due to such a difference between the substrates, the high-concentration impurity layer 130b-1 may be configured as a layer having a high P-type impurity concentration, and the high-concentration impurity layer 130b-2 may be configured as a layer having a high N-type impurity concentration. That is, the high-concentration impurity layer 130b-1 and the high-concentration impurity layer 130b-2 may be formed as layers doped with different impurities (different carrier type layers).

Further, even when the logic chip 102-1 and the logic chip 102-2 are substrates of the same carrier, the high-concentration impurity layer 130b-1 and the high-concentration impurity layer 130b-2 may be formed as layers of different carriers.

Also in the imaging element 12b illustrated in FIGS. 7 and 8, it is possible to curb an increase in leakage between the wells through the defects formed near the interface even when the thickness of the logic chip 102 is reduced, by forming the high-concentration impurity layer 130b.

Further, when the logic chip 102 can be formed to be thin, a depth of a gap between the logic chip 102-1 and the logic chip 102-2 can also be made small. Because the gap has the same depth as the thickness of the logic chip 102, the gap is made shallow when the logic chip 102 is made thin.

When a gap between the logic chips 102 is deep, it becomes difficult to completely fill the gap with the oxide film 201, and a gap containing air is likely to be formed in the oxide film 201. When there is a gap in the oxide film 201, the support base 103 to be laminated is likely to be bent or thermally expanded.

However, according to the present technology, because the logic chip 102 can be made thin and the gap between the logic chips 102 can be formed shallowly, it is possible to sufficiently fill the gap with the oxide film 201. Therefore, it is possible to prevent the support base 103 from being bent or a gap containing air from being formed between the logic chips 102.

Third Embodiment

Figure 9:
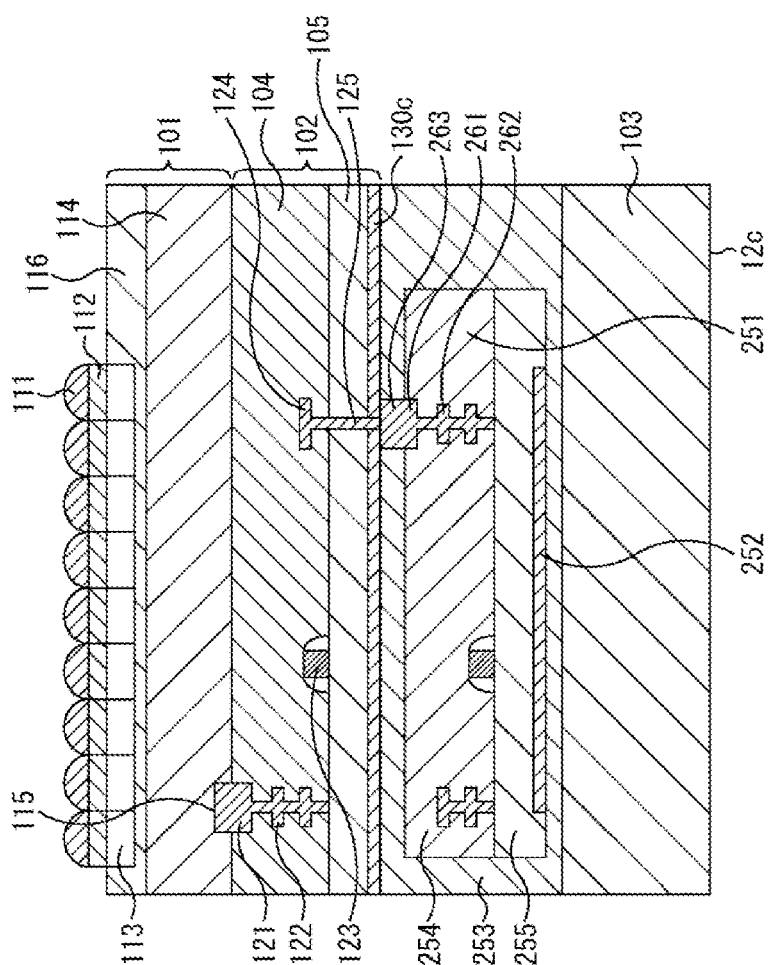
FIG. 9 is a diagram illustrating a cross-sectional configuration example of an imaging element in a third embodiment.

FIG. 9 illustrates an example of a cross-sectional configuration of the imaging element 12 (referred to as an imaging element 12c) in a third embodiment.

The imaging element 12c in the third embodiment differs from the imaging element 12a in the first embodiment in that a chip 251 is laminated, and is basically the same as the other points.

The chip 251 may be a chip on which a logic circuit is formed or may be a chip on which a memory is formed. Further, the chip 251 may be a signal processing chip having an artificial intelligence (AI) function.

Further, although the case in which only the chip 251 is laminated in a third layer has been illustrated herein, two or more chips may be laminated (disposed), as in the imaging element 12b illustrated in FIG. 7, for example. Further, when two or more chips are laminated in the third layer, a chip having a memory function and a chip having an AI function may be laminated (disposed).

The chip 251 is laminated on the logic chip 102 via the high-concentration impurity layer 130. The chip 251 is configured of a multi-layer wiring layer 254 and a silicon substrate 255, like the logic chip 102. A wiring 262 is formed in the multi-layer wiring layer 254.

The logic chip 102 and the chip 251 are connected by a pad, like the CIS chip 101 and the logic chip 102. In the chip 251, a pad 261 is formed on the side on which the logic chip 102 is laminated. A wiring 262 formed in a wiring layer in the chip 251 is connected to the pad 261.

The pad 261 formed in the chip 251 is connected to a pad 263 formed in the oxide film 253, and the pad 263 is connected to a wiring 124 in the multi-layer wiring layer 104 of the logic chip 102 via a via 125. Although the case in which the logic chip 102 and the chip 251 are electrically connected by the pad 261 and the pad 263 has been illustrated herein, the logic chip 102 and the chip 251 may be connected using another connection method.

A high-concentration impurity layer 252 is formed on a surface (back surface) opposite to the surface on which the logic chip 102 of the chip 251 is laminated, in other words, on the silicon substrate 255 side. This high-concentration impurity layer 252 is formed only on a part of the back surface. In the cross-sectional view illustrated in FIG. 9, the high-concentration impurity layer 252 is not formed on the end portion side of the chip 251. Further, the chip 251 is in a state of being embedded in the oxide film 253 including the high-concentration impurity layer 252.

A high-concentration impurity layer 130c is formed to cover the entire back surface of the logic chip 102, whereas the high-concentration impurity layer 252 is formed (in a region of a part of the back surface of the chip 251) to cover the part of the back surface of the chip 251. The high-concentration impurity layer may be formed to cover an entire predetermined surface of the chip, or may be formed to cover a part of the predetermined surface of the chip. Further, when the high-concentration impurity layer is formed to cover the part of the predetermined surface of the chip, for example, the high-concentration impurity layer may be formed in a striped shape. The high-concentration impurity layer may be formed in a region in which leakage is likely to occur due to defects.

When a plurality of chips are laminated as in the third embodiment, it is possible to form a high-concentration impurity layer on one or each of the plurality of chips. Further, even in the case in which chips of different sizes, such as the logic chip 102 and the chip 251, are laminated, the present technology can be applied.

Also in the imaging element 12c according to the third embodiment, it is possible to curb an increase in leakage between the wells through the defects formed near the interface even when the thickness of the logic chip 102 or the chip 251 is reduced, by forming the high-concentration impurity layer 130c and the high-concentration impurity layer 252.

Fourth Embodiment

A fourth embodiment will be described. The first to third embodiments have been described with reference to the imaging element 12 including the high-concentration impurity layer as an example, but it is possible to form the high-concentration impurity layer in chips other than chips constituting the imaging element.

Figure 10:
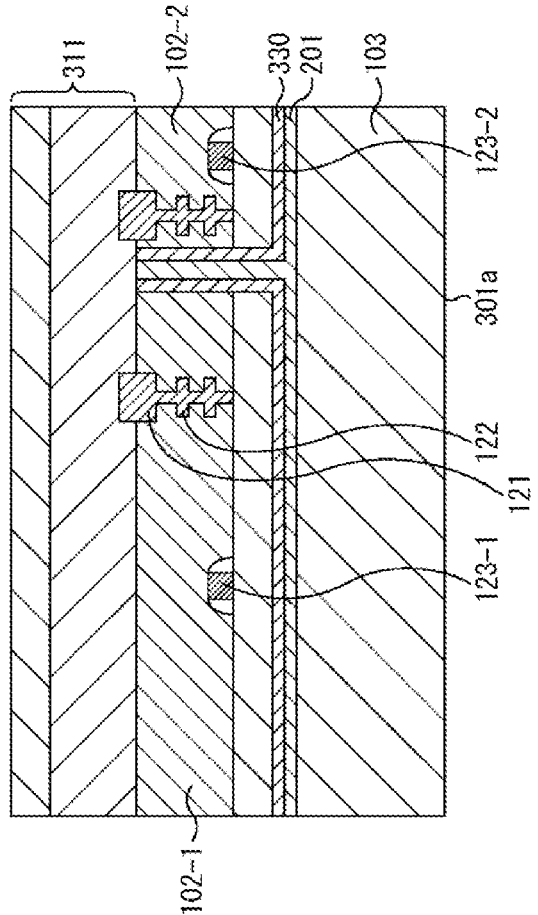
FIG. 10 is a diagram illustrating a cross-sectional configuration example of a laminated chip in a fourth embodiment.

FIG. 10 is a diagram illustrating a configuration example of a laminated chip in a fourth embodiment. In a laminated chip 301a illustrated in FIG. 10, a memory chip 311, a logic chip 102, and a support base 103 are laminated in this order from the upper side in FIG. 10. The laminated chip 301a illustrated in FIG. 10 differs in that the memory chip 311 is used instead of the CIS chip 101 of the imaging element 12b illustrated in FIG. 8, and is the same in the other points.

In the laminated chip 301a illustrated in FIG. 10, the logic chip 102-1 and the logic chip 102-2 are laminated (disposed) with respect to one memory chip 311. According to the laminated chip 301a, for example, data processed by the logic chip 102-1 can be stored in the memory chip 311, and the logic chip 102-2 can perform predetermined processing using the stored data.

A high-concentration impurity layer 330 is formed on the back surface of each of the logic chip 102-1 and the logic chip 102-2 of the laminated chip 301a. The high-concentration impurity layer 330 is, for example, a layer corresponding to the high-concentration impurity layer 130b of the imaging element 12b in the second embodiment, and can have the same configuration (a material or the like) as the high-concentration impurity layer 130a in the first embodiment. Therefore, even when the logic chip 102-1 or the logic chip 102-2 is formed in a thinner shape, it is possible to prevent leakage from occurring (increasing) due to defects on the back surface side.

It is possible to reduce the thickness of the laminated chip 301a itself in which the logic chip 102-1 and the logic chip 102-2 are laminated, by reducing thicknesses of the logic chip 102-1 and the logic chip 102-2. Therefore, it is possible to make the laminated chip 301a shorter and smaller.

Fifth Embodiment

Figure 11:
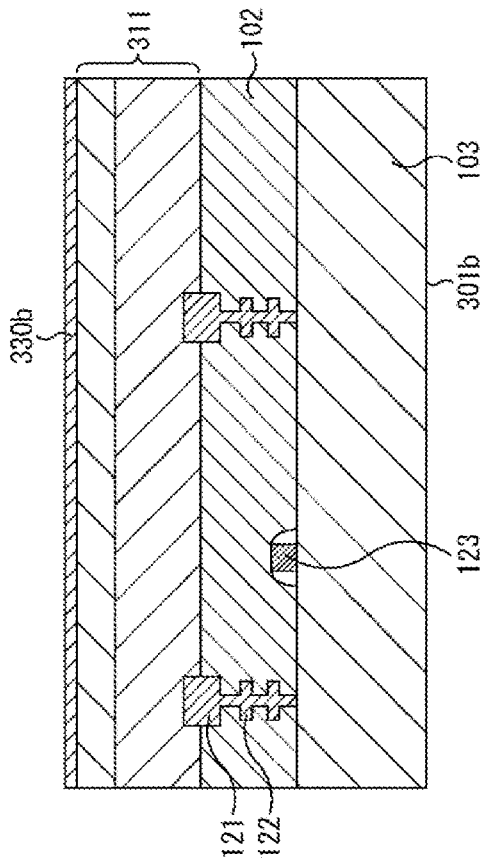
FIG. 11 is a diagram illustrating a cross-sectional configuration example of a laminated chip in a fifth embodiment.

FIG. 11 is a diagram illustrating a configuration example of a laminated chip 301b according to a fifth embodiment.

In the laminated chip 301b in the fifth embodiment, the memory chip 311, the logic chip 102, and the support base 103 are laminated, as in the laminated chip 301a (FIG. 10) of the fourth embodiment. In the laminated chip 301b in the fifth embodiment, the high-concentration impurity layer 330b is formed in the memory chip 311.

The high-concentration impurity layer 330 may be formed in the logic chip 102 as in the laminated chip 301a illustrated in FIG. 10, or may be formed in the memory chip 311 as in the laminated chip 301b illustrated in FIG. 11.

Further, the high-concentration impurity layer 330 may be formed on a surface on the side in which the support base 103 is laminated, or may be formed on a surface on the side in which the support base 103 is not laminated. Further, the high-concentration impurity layer 330 may be formed on a side in which other chips are not laminated as in the example illustrated in FIG. 11 and, in other words, may be formed in an exposed state.

Further, the logic chip 102 laminated (disposed) in the memory chip 311 may be a plurality of logic chips 102 as in the laminated chip 301a of the fourth embodiment, or may be one logic chip 102 as in the laminated chip 301b of the fifth embodiment.

The fourth embodiment and the fifth embodiment may be combined to form a high-concentration impurity layer on both the memory chip 311 and the logic chip 102.

The high-concentration impurity layer is formed on a predetermined surface of one or more of the plurality of chips constituting the laminated chip 301. Further, chips to be laminated (disposed) may be one-to-one or one-to-many.

It is possible to prevent leakage through defects formed at the time of thinning from occurring even when there are the defects, by thinly forming a chip to be thinly formed and forming a high-concentration impurity layer on the thinly formed chip. Therefore, it is possible to laminate the thinly formed chip capable of curbing leakage, and it is possible to make the laminated chip 301 shorter and smaller.

Sixth Embodiment

Figure 12:
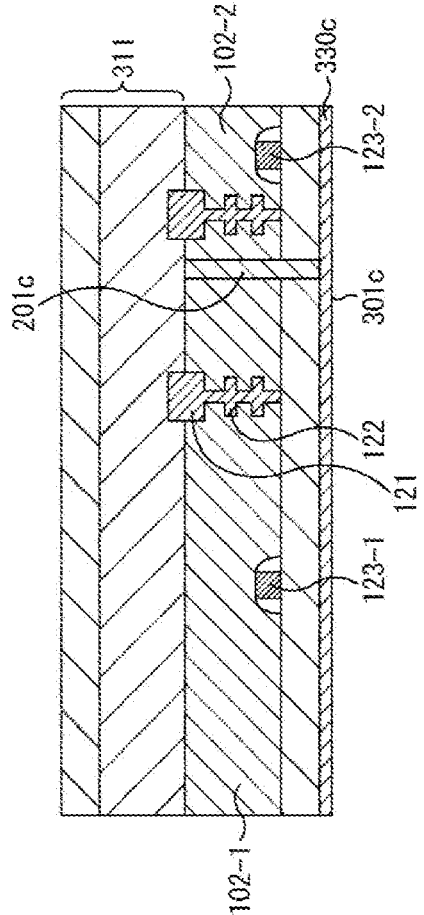
FIG. 12 is a diagram illustrating a cross-sectional configuration example of a laminated chip in a sixth embodiment.

FIG. 12 is a diagram illustrating a configuration example of a laminated chip 301c in a sixth embodiment.

The laminated chip 301c in the sixth embodiment differs from the laminated chip 301a in the fourth embodiment in that the support base 103 is deleted from the laminated chip 301a in the fourth embodiment. The laminated chip 301c may have a configuration in which the support base 103 is not provided in the laminated chip 301.

Further, the laminated chip 301c in the sixth embodiment differs from the laminated chip 301a in the fourth embodiment in that a portion of the gap between the logic chip 102-1 and the logic chip 102-2 is filled with only an oxide film 201c. In other words, the high-concentration impurity layer 330c is not formed on a side surface of each of the logic chip 102-1 and the logic chip 102-2.

The laminated chip 301c may have a configuration in which a high-concentration impurity layer is formed on a side surface of a chip, or a high-concentration impurity layer is not formed.

Whether or not a high-concentration impurity layer is formed on the side surface of the chip depends on a difference in the manufacturing process. As illustrated in FIG. 12, when the high-concentration impurity layer 330c is not formed on the side surfaces of the logic chip 102-1 and the logic chip 102-2, the logic chip 102-1 and the logic chip 102-1 are disposed in the memory chip 311, and then, a space (gap) between the logic chip 102-1 and the logic chip 102-2 is filled with the oxide film 201c.

When the gap is filled with the oxide film 201c, the oxide film 201c is also formed on the back surface side of the logic chip 102-1 and the logic chip 102-2, but the oxide film 201c formed on the back surface side thereof is removed by, for example, chemical mechanical polish (CMP). Thereafter, when the high-concentration impurity layer 330c is formed, the laminated chip 301c as illustrated in FIG. 12 is manufactured.

FIG. 10 will be referred to again. When the high-concentration impurity layer 330 is formed on the side surfaces of the logic chip 102-1 and the logic chip 102-2 as in the laminated chip 301a illustrated in FIG. 10, the logic chip 102-1 and the logic chip 102-1 are disposed in the memory chip 311, and then, the high-concentration impurity layer 330 is formed on the side surface and the back surface of each of the logic chip 102-1 and the logic chip 102-2.

Thereafter, the gap between the logic chip 102-1 and the logic chip 102-2 is filled with the oxide film 201, and the oxide film 201 is formed on the back surface of each of the logic chip 102-1 and the logic chip 102-2. When the high-concentration impurity layer 330 is formed and then the oxide film 201 is formed in this way, the laminated chip 301a as illustrated in FIG. 10 is manufactured.

Also in the laminated chip 301c in the sixth embodiment illustrated in FIG. 12, it is possible to curb occurrence (increase) of the leakage through the defects by forming the high-concentration impurity layer 330c, as in the above-described embodiment. Therefore, it is possible to form the laminated chip 301c in a thinner shape. Further, it is possible to form the laminated chip 301c on the thinner side by adopting a configuration in which the support base 103 is not included.

It is possible to mount such a laminated chip 301c that does not include the support base 103 in a small gap.

Seventh Embodiment

Figure 13:
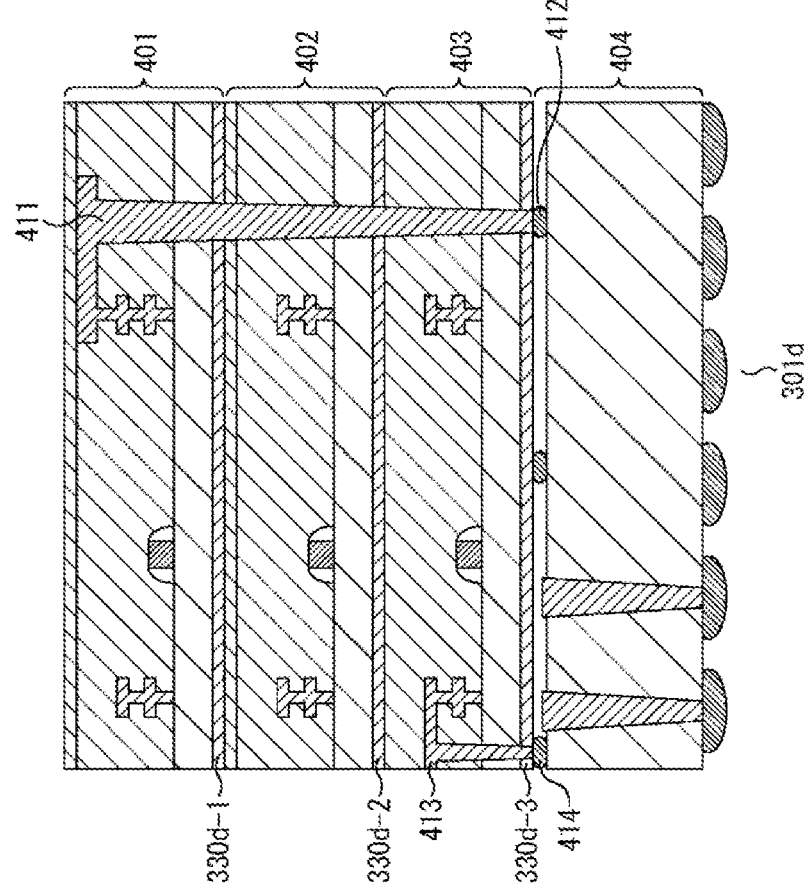
FIG. 13 is a diagram illustrating a cross-sectional configuration example of a laminated chip in a seventh embodiment.

FIG. 13 is a diagram illustrating a configuration example of a laminated chip 301d in a seventh embodiment.

The laminated chip 301d in the seventh embodiment has a configuration in which a plurality of chips are laminated. Although, in the above-described embodiment, a case in which the chip is a CIS chip, a memory chip, a logic chip, or the like has been described by way of example, a chip to be laminated may be any of these chips or may be another chip that is not illustrated.

An example in which, in the laminated chip 301d illustrated in FIG. 13, the chip 401, the chip 402, and the chip 403 are laminated in this order from the top of FIG. 13, and the support base 404 is further laminated is illustrated. Each of the chip 401, the chip 402, and the chip 403 can be a chip such as a CIS chip, a memory chip, and a logic chip.

A high-concentration impurity layer 330d-1 is formed on the back surface of the chip 401, a high-concentration impurity layer 330d-2 is formed on the back surface of chip 402, and a high-concentration impurity layer 330d-3 is formed on the back surface of the chip 403. Because the chips 401 to 403 include high-concentration impurity layers 330$d$-1 to 330$d$-3, respectively, a configuration capable of curbing the occurrence of the leakage is obtained.

Further, it is possible to form each of the chips 401 to 403 on the thin side. It is possible to make the laminated chip 301$d$ itself shorter and smaller by forming each of the chips 401 to 403 in a thinner shape.

The laminated chip 301$d$ illustrated in FIG. 13 has a configuration in which the three chips 401 to 403 are laminated, but the present technology can also be applied to a case in which four or more chips are laminated. Further, according to the present technology, because it is possible to make each chip shorter, it is possible to make a plurality of chips shorter as compared with the related art when the plurality of chips are laminated.

A through-silicon via (TSV), a bump, a CuCu connection, and the like can be applied for the connection of the respective chips 401 to 403. For example, the chip 401 and the support base 404 are connected by a TSV 411. Further, the TSV 411 and the support base 404 are connected by a bump 412.

Similarly, the chip 403 and the support base 404 are connected by the TSV 413, and the TSV 413 and the support base 404 are connected by a bump 414.

By applying the present technology, it is possible to thinly form the TSV 411 and the TSV 413. For example, the TSV 411 is formed from the chip 401 to the bump 412 via the chip 402 and the chip 403. The TSV is generally formed in a so-called tapered shape that has a wide opening portion and gradually narrows from the opening portion.

Generally, when a depth at which the TSV 411 is formed becomes larger, the opening portion of the tapered shape should be formed to be larger and thicker. According to the present technology, it is possible to thinly form each of the chips 401 to 403.

Therefore, it is possible to shorten the depth at which the TSV 411 is formed and to thinly form the TSV 411. By thinly forming the TSV 411, it is possible to reduce an area in which the TSV 411 is formed in a plane, and to make the laminated chip 301$d$ smaller.

Also in the laminated chip 301$d$ in the seventh embodiment illustrated in FIG. 13, it is possible to curb occurrence (increase) of the leakage through the defects by forming the high-concentration impurity layer 330$d$, as in the above-described embodiment. Therefore, it is possible to form the laminated chip 301$d$ in a thinner shape, and to realize the shorter and smaller laminated chip 301$d$.

Eighth Embodiment

Figure 14:
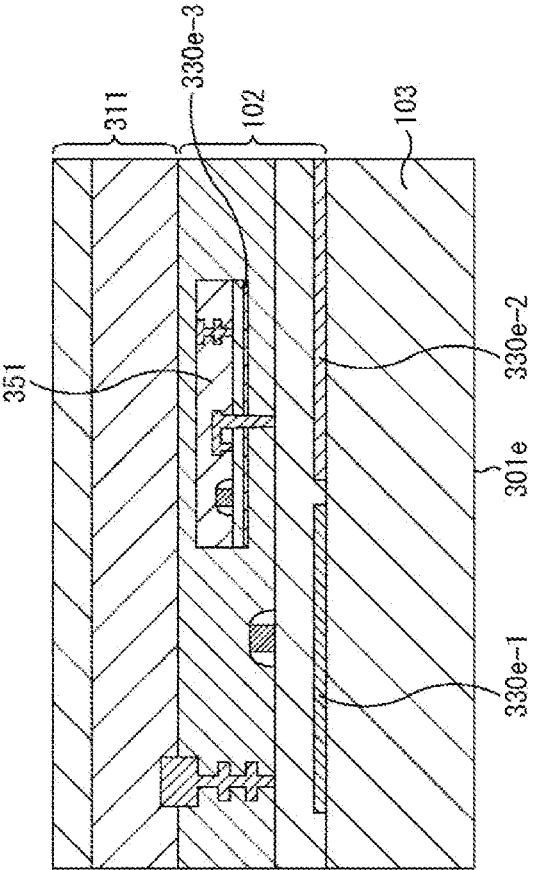
FIG. 14 is a diagram illustrating a cross-sectional configuration example of a laminated chip in an eighth embodiment.

FIG. 14 is a diagram illustrating a configuration example of a laminated chip 301$e$ in an eighth embodiment.

The laminated chip 301$e$ in the eighth embodiment differs from the laminated chip 301$b$ (FIG. 11) in the fifth embodiment in that the logic chip 102 is configured to include a monolithic device. The monolithic device is an integrated circuit in which transistors, diodes, resistors, capacitors, and the like are made and wired on or in one substrate.

In the example illustrated in FIG. 14, a monolithic device 351 is embedded in the logic chip 102. It is possible to increase a mounting area by the logic chip 102 having a configuration in which the monolithic device 351 is embedded in the logic chip 102.

Further, in the example illustrated in FIG. 14, the high-concentration impurity layer 330$e$-1 and the high-concentration impurity layer 330$e$-2 are formed on the back surface of the logic chip 102. Further, a high-concentration impurity layer 130$e$-3 is formed on the back surface side of the silicon substrate on which the device of the monolithic device 351 is not formed. The high-concentration impurity layer 330$e$-1, the high-concentration impurity layer 330$e$-2, and the high-concentration impurity layer 130$e$-3 may be, for example, layers having a different concentration of impurities, different carriers such as P-type and N-type carriers, or different characteristics. Further, the high-concentration impurity layer 330$e$-1 and the high-concentration impurity layer 330$e$-2 can be layers having characteristics of a chip in a region to be formed, such as characteristics suitable for the chip depending on whether the chip is of a P type or an N type.

Thus, it is possible form a high-concentration impurity layer regardless of a type of chip. Also in the laminated chip 301$e$ in the eighth embodiment illustrated in FIG. 14, it is possible to curb occurrence (increase) of the leakage through the defects by forming the high-concentration impurity layer 330$e$, as in the above-described embodiment. Therefore, it is possible to form the laminated chip 301$e$ in a thinner shape, and to make the laminated chip 301$e$ shorter and smaller.

Ninth Embodiment

Figure 15:
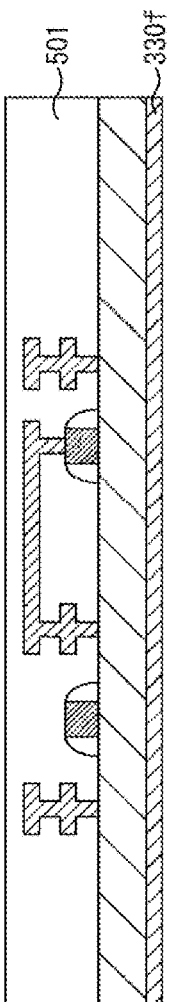
FIG. 15 is a diagram illustrating a cross-sectional configuration example of a single-layer chip in a ninth embodiment.

FIG. 15 is a diagram illustrating a configuration example of a single-layer chip 501 in a ninth embodiment.

Although, in the first to eighth embodiments, a case in which a plurality of chips are laminated has been described by way of example, one chip (single layer) may be used, as illustrated in FIG. 15. The single-layer chip 501 illustrated in FIG. 15 is configured of a single layer, and a high-concentration impurity layer 330$f$ is formed on the back surface thereof.

Also in the single-layer chip 501 in the ninth embodiment illustrated in FIG. 15, it is possible to curb occurrence (increase) of the leakage through the defects by forming the high-concentration impurity layer 330$f$, as in the above-described embodiment. Therefore, it is possible to form the single-layer chip 501 in a thinner shape, and to make the single-layer chip 501 shorter and smaller.

Because the single-layer chip 501 is a single layer and is formed to be thin, such as 20 $\mu$m or less, the single-layer chip 501 can be used as a bendable device such as a wearable device.

According to the present technology, even when defects occur in a chip (device), it is possible to prevent a leakage from occurring (increasing) due to the defects. Therefore, it is possible to make the chip (device) thinner, shorter, and smaller. Further, because characteristics of the chip (device) do not change even when a high-concentration impurity layer is formed on the chip (device), it is possible to obtain the above-described effects while maintaining the characteristics of the chip (device).

Further, the high-concentration impurity layer can be formed on the back surface of the chip (device) not to influence a deep position of the chip (device). A region corresponding to a source or drain of a transistor, for example, is formed at the deep position of the chip (device), but the reliability of the chip (device) does not deteriorate because the high-concentration impurity layer is not formed at a position at which such a region is influenced.

<Example of Application to Endoscopic Surgery System>

The technology related to this disclosure (the present technology) can be applied to various products. For example, a technology according to the present disclosure may be applied to an endoscopic surgery system.

Figure 16:
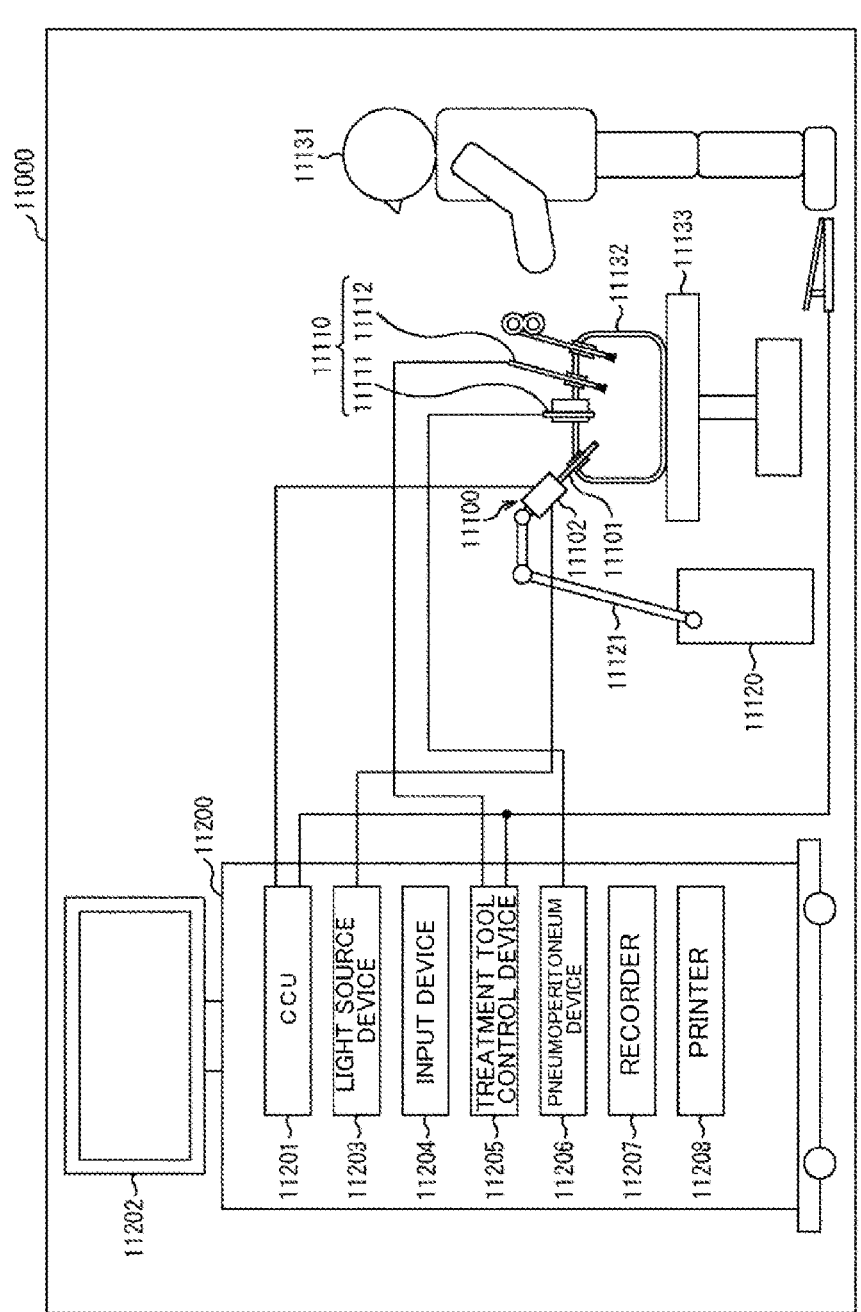
FIG. 16 is a diagram illustrating an example of a schematic configuration of an endoscopic surgery system.

FIG. 16 is a diagram illustrating an example of a schematic configuration of an endoscopic surgery system to which the technology according to the present disclosure (the present technology) can be applied.

In FIG. 16, a state in which a surgeon (a doctor) 11131 is operating on a patient 11132 on a patient bed 11133 using an endoscopic surgery system 11000 is illustrated. The endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted, as illustrated in FIG. 16.

The endoscope 11100 includes a lens barrel 11101 of which a region having a predetermined length from a tip thereof is inserted into a body cavity of the patient 11132, and a camera head 11102 connected to a base end of the lens barrel 11101. In the illustrated example, the endoscope 11100 configured as a so-called rigid endoscope having the rigid lens barrel 11101 is illustrated, but the endoscope 11100 may be configured as a so-called flexible endoscope having a flexible lens barrel.

An opening in which an objective lens is fitted is provided at the tip of the lens barrel 11101. A light source device 11203 is connected to the endoscope 11100, and light generated by the light source device 11203 is guided to the tip of the lens barrel by a light guide extending inside the lens barrel 11101 and radiated toward an observation target in the body cavity of the patient 11132 via the objective lens. The endoscope 11100 may be a direct-viewing endoscope or may be a perspective-viewing endoscope or a side-viewing endoscope.

An optical system and an imaging element are provided inside the camera head 11102, and reflected light (observation light) from the observation target is condensed on the imaging element by the optical system. The observation light is photoelectrically converted by the imaging element, and an electrical signal corresponding to the observation light, that is, an image signal corresponding to an observation image is generated. The image signal is transmitted as RAW data to a camera control unit (CCU) 11201.

The CCU 11201 is configured of a central processing unit (CPU), a graphics processing unit (GPU), or the like, and performs overall control of operations of the endoscope 11100 and a display device 11202. Further, the CCU 11201 receives the image signal from the camera head 11102, and performs various types of image processing for displaying an image based on the image signal, such as development processing (demosaic processing), on the image signal.

The display device 11202 displays the image based on the image signal subjected to the image processing by the CCU 11201 under the control of the CCU 11201.

The light source device 11203 is configured using, for example, a light source such as a light emitting diode (LED), and supplies the endoscope 11100 with irradiation light when a surgical site or the like is photographed.

An input device 11204 is an input interface for the endoscopic surgery system 11000. A user can input various types of information or instructions to the endoscopic surgery system 11000 via the input device 11204. For example, the user inputs an instruction to change imaging conditions (a type of irradiation light, magnification, focal length, or the like) according to the endoscope 11100.

A treatment tool control device 11205 controls driving of the energy treatment tool 11112 for cauterization or incision of a tissue, sealing of blood vessel, or the like. A pneumoperitoneum device 11206 sends a gas into the body cavity of the patient 11132 via the pneumoperitoneum tube 11111 in order to inflate the body cavity for the purpose of securing a field of view using the endoscope 11100 and a working space of the surgeon. A recorder 11207 is a device capable of recording various types of information on surgery. A printer 11208 is a device capable of printing various types of information on surgery in various formats such as text, images, and graphs.

The light source device 11203 that supplies the endoscope 11100 with the irradiation light when a surgical site is photographed can be configured using, for example, an LED, a laser light source, or a white light source configured using a combination thereof. When a white light source is configured in a combination of RGB laser light sources, an output intensity and an output timing of each color (each wavelength) can be controlled with high accuracy and thus, adjustment of the white balance of the captured image can be performed in the light source device 11203. Further, in this case, the observation target is irradiated with laser light from the respective RGB laser light sources in a time division manner, and driving of the imaging element of the camera head 11102 is controlled in synchronization with an irradiation timing such that images corresponding to the respective RGB can also be captured in a time division manner. According to this method, it is possible to obtain a color image without providing a color filter in the imaging element.

Further, driving of the light source device 11203 may be controlled so that an intensity of output light is changed at predetermined time intervals. The driving of the imaging element of the camera head 11102 is controlled in synchronization with a timing of changing the intensity of the light, and images are acquired in a time division manner and combined, such that an image having a high dynamic range without so-called blackout and whiteout can be generated.

Further, the light source device 11203 may be configured to be able to supply light having a predetermined wavelength band corresponding to special light observation. In the special light observation, for example, so-called narrow band imaging in which a predetermined tissue such as a blood vessel of a mucosal surface layer is imaged with high contrast through irradiation with light in a narrower band than irradiation light (that is, white light) at the time of normal observation using a dependence of absorption of light in a body tissue on a wavelength is performed. Alternatively, in the special light observation, fluorescence observation in which an image is obtained using fluorescence generated through excitation light irradiation may be performed. In the fluorescence observation, a body tissue can be irradiated with excitation light and fluorescence from the body tissue can be observed (autofluorescence observation), or a reagent such as indocyanine green (ICG) can be locally injected into a body tissue and the body tissue can be irradiated with excitation light corresponding to a fluorescence wavelength of the reagent so that a fluorescence image is obtained. The light source device 11203 can be configured to be able to supply narrow band light and/or excitation light corresponding to such special light observation.

Figure 17:
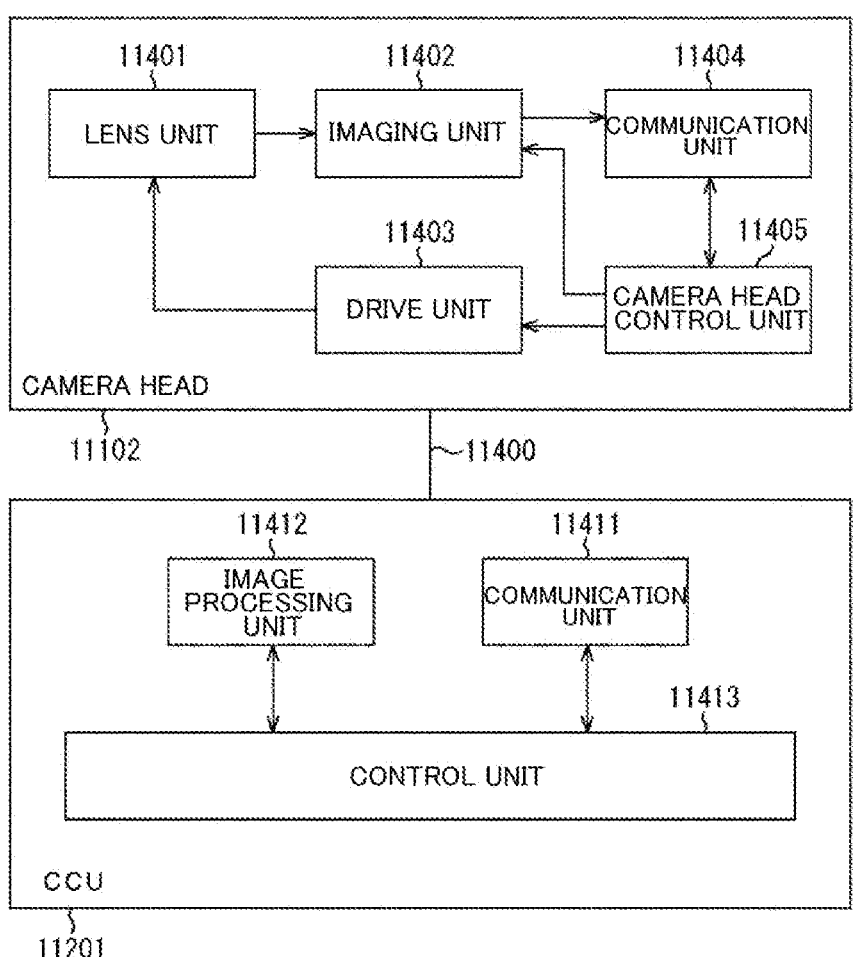
FIG. 17 is a block diagram illustrating an example of a functional configuration of a camera head and a CCU.

FIG. 17 is a block diagram illustrating an example of a functional configuration of the camera head 11102 and the CCU 11201 illustrated in FIG. 16.

The camera head 11102 includes a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicatively connected to each other by a transmission cable 11400.

The lens unit 11401 is an optical system provided in a connection portion for connection to the lens barrel 11101. Observation light taken from a tip of the lens barrel 11101 is guided to the camera head 11102 and is incident on the lens unit 11401. The lens unit 11401 is configured in combination of a plurality of lenses including a zoom lens and a focus lens.

The number of imaging elements constituting the imaging unit 11402 may be one (so-called single-plate type) or may be plural (so-called multi-plate type). When the imaging unit 11402 is configured in a multi-plate type, for example, image signals corresponding to RGB may be generated by respective imaging elements and combined so that a color image may be obtained. Alternatively, the imaging unit 11402 may be configured to include a pair of imaging elements for acquiring image signals for a right eye and a left eye corresponding to a 3D (dimensional) display. The performed 3D display allows the surgeon 11131 to more accurately ascertain a depth of a living tissue in the surgical site. When the imaging unit 11402 is configured in a multi-plate type, a plurality of systems of lens units 11401 may be provided in correspondence to the imaging elements.

Further, the imaging unit 11402 does not necessarily have to be provided in the camera head 11102. For example, the imaging unit 11402 may be provided immediately after the objective lens inside the lens barrel 11101.

The drive unit 11403 includes an actuator and moves the zoom lens and the focus lens of the lens unit 11401 by a predetermined distance along an optical axis under the control of the camera head control unit 11405. This allows a magnification and a focus of the image captured by the imaging unit 11402 to be adjusted appropriately.

The communication unit 11404 is configured using a communication device for transmitting and receiving various types of information to and from the CCU 11201. The communication unit 11404 transmits the image signal obtained from the imaging unit 11402 as RAW data to the CCU 11201 via the transmission cable 11400.

Further, the communication unit 11404 receives a control signal for controlling driving of the camera head 11102 from the CCU 11201 and supplies the control signal to the camera head control unit 11405. The control signal includes, for example, information on imaging condition, such as information indicating that a frame rate of the captured image is designated, information indicating that an exposure value at the time of imaging is designated, and/or information indicating that the magnification and focus of the captured image is designated.

The imaging conditions such as the frame rate, the exposure value, the magnification, and the focus may be appropriately designated by the user or may be automatically set by the control unit 11413 of the CCU 11201 on the basis of the acquired image signal. In the latter case, so-called auto exposure (AE), auto focus (AF) function, and auto white balance (AWB) function are provided in the endoscope 11100.

The camera head control unit 11405 controls driving of the camera head 11102 on the basis of a control signal from the CCU 11201 received via the communication unit 11404.

The communication unit 11411 includes a communication device for transmitting and receiving various types of information to and from the camera head 11102. The communication unit 11411 receives the image signal transmitted from the camera head 11102 via the transmission cable 11400.

Further, the communication unit 11411 transmits the control signal for controlling the driving of the camera head 11102 to the camera head 11102. The image signal or the control signal can be transmitted through electric communication, optical communication, or the like.

The image processing unit 11412 performs various types of image processing on the image signal that is the RAW data transmitted from the camera head 11102.

The control unit 11413 performs various controls regarding imaging of the surgical site or the like by the endoscope 11100 and a display of a captured image obtained by imaging the surgical site or the like. For example, the control unit 11413 generates the control signal for controlling the driving of the camera head 11102.

Further, the control unit 11413 causes the display device 11202 to display the captured image of the surgical site or the like on the basis of the image signal subjected to the image processing in the image processing unit 11412. In this case, the control unit 11413 may recognize various objects in the captured image using various image recognition techniques. For example, the control unit 11413 can detect a shape, color, or the like of edges of the object included in the captured image to recognize surgical tools such as forceps, a specific living body portion, bleeding, a mist when the energy treatment tool 11112 is used, or the like. When the control unit 11413 causes the captured image to be displayed on the display device 11202, the control unit 11413 may cause various types of surgery assistance information to be superimposed on the image of the surgical site and displayed using a result of the recognition. Superimposing and displaying the surgery assistance information and presenting the surgery assistance information to the surgeon 11131 makes it possible to reduce a burden on the surgeon 11131 and for the surgeon 11131 to reliably proceed with the surgery.

The transmission cable 11400 that connects the camera head 11102 and the CCU 11201 is an electrical signal cable compatible with communication of electrical signals, an optical fiber compatible with optical communication, or a composite cable of these.

Here, although wired communication is performed using the transmission cable 11400 in the illustrated example, communication between the camera head 11102 and the CCU 11201 may be performed wirelessly.

<Example of Application to Mobile Object>

The technology related to this disclosure (the present technology) can be applied to various products. Further, the technology according to the present disclosure may be realized as a device mounted in any type of a mobile object such as an automobile, an electric vehicle, a hybrid electric vehicle, a motorcycle, a bicycle, a personal mobility, an airplane, a drone, a ship, and a robot.

Figure 18:
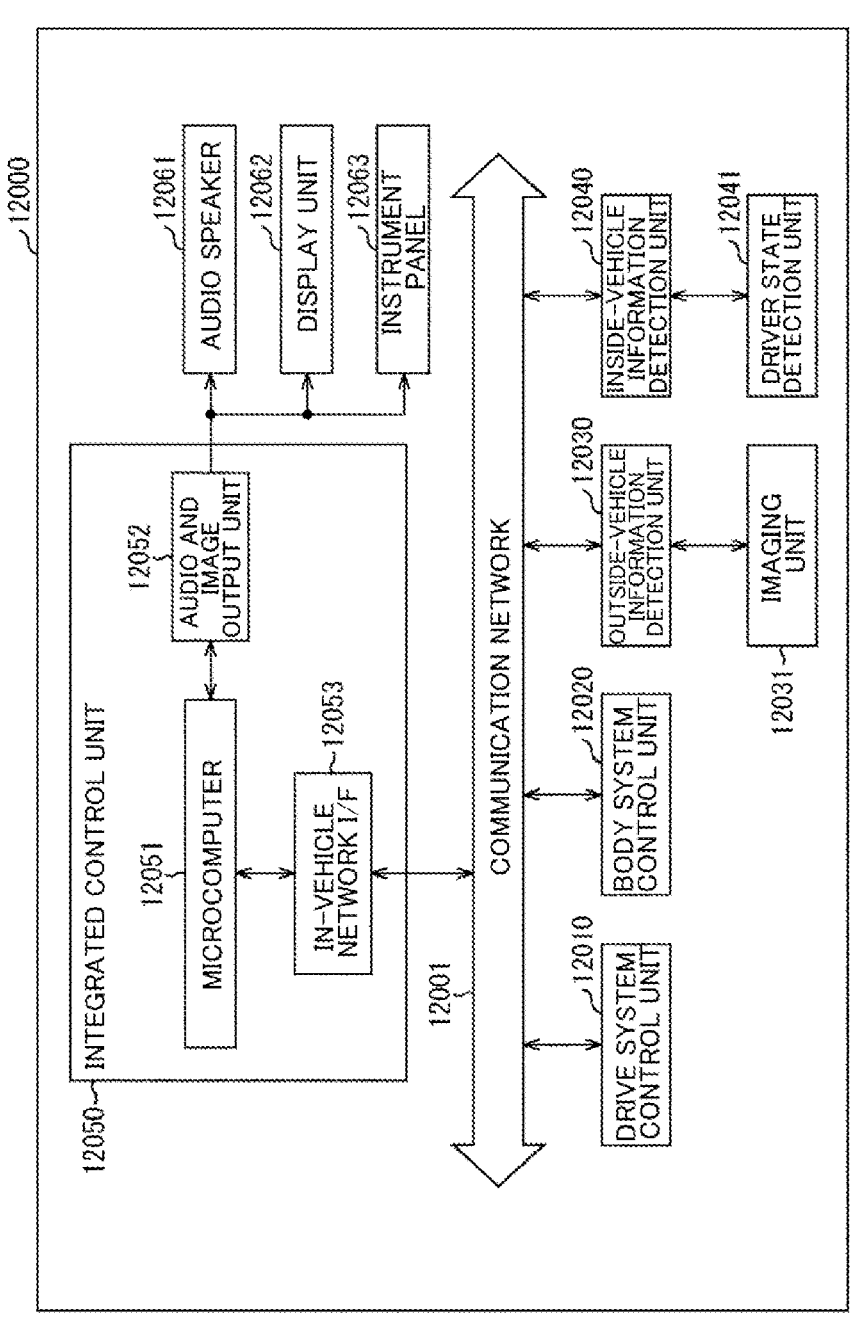
FIG. 18 is a block diagram illustrating an example of a schematic configuration of a vehicle control system.

FIG. 18 is a block diagram illustrating a schematic configuration example of a vehicle control system that is an example of a mobile object control system to which the technology according to the present disclosure can be applied.

A vehicle control system 12000 includes a plurality of electronic control units connected via a communication network 12001. In the example illustrated in FIG. 18, the vehicle control system 12000 includes a drive system control unit 12010, a body system control unit 12020, an outside-vehicle information detection unit 12030, an inside-vehicle information detection unit 12040, and an integrated control unit 12050. Further, a microcomputer 12051, an audio and image output unit 12052, and an in-vehicle network interface (I/F) 12053 are shown as a functional configuration of the integrated control unit 12050.

The drive system control unit 12010 controls an operation of devices relevant to a drive system of a vehicle according to various programs. For example, the drive system control unit 12010 functions as a control device for a drive force generation device for generating a drive force of a vehicle, such as an internal combustion engine or a drive motor, a drive force transmission mechanism for transmitting the drive force to wheels, a steering mechanism for adjusting a steering angle of the vehicle, a braking device that generates the braking force of the vehicle, and the like.

The body system control unit 12020 controls operations of various devices mounted in a vehicle body according to various programs. For example, the body system control unit 12020 functions as a keyless entry system, a smart key system, a power window device, or a control device for various lamps such as a head lamp, a back lamp, a brake lamp, an indicator, or a fog lamp. In this case, radio waves transmitted from a portable device that substitutes for a key or signals of various switches can be input to the body system control unit 12020. The body system control unit 12020 receives input of the radio waves or signals and controls a door lock device, a power window device, a lamp, and the like of the vehicle.

The outside-vehicle information detection unit 12030 detects information on the outside of the vehicle in which the vehicle control system 12000 has been mounted. For example, the imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform an object detection processing or a distance detection processing such as people, vehicles, obstacles, signs, or characters on road surfaces on the basis of the received image.

The imaging unit 12031 is an optical sensor that receives light and outputs an electrical signal according to the amount of received light. The imaging unit 12031 can output the electrical signal as an image or can output the electrical signal as distance measurement information. Further, the light received by the imaging unit 12031 may be visible light or may be invisible light such as infrared rays.

The inside-vehicle information detection unit 12040 detects information on the inside of the vehicle. A driver state detection unit 12041 that detects a state of a driver, for example, is connected to the inside-vehicle information detection unit 12040. The driver state detection unit 12041 includes, for example, a camera that images the driver, and the inside-vehicle information detection unit 12040 may calculate a degree of fatigue or a degree of concentration of the driver on the basis of detection information input from the driver state detection unit 12041 or may determine whether or not the driver is drowsing.

The microcomputer 12051 can calculate a control target value of the driving force generation device, the steering mechanism, or the braking device on the basis of the information on the inside or the outside of the vehicle acquired by the outside-vehicle information detection unit 12030 or the inside-vehicle information detection unit 12040, and output a control command to the drive system control unit 12010. For example, the microcomputer 12051 can perform cooperative control for the purpose of realization of functions of an advanced driver assistance system (ADAS) including collision avoidance or impact mitigation of a vehicle, follow-up traveling based on an inter-vehicle distance, vehicle speed keeping traveling, a vehicle collision warning, a vehicle lane departure warning, and the like.

Further, the microcomputer 12051 can control the driving force generation device, the steering mechanism, the braking device, or the like on the basis of information on the vicinity of the vehicle acquired by the outside-vehicle information detection unit 12030 or the inside-vehicle information detection unit 12040, to thereby perform cooperative control for the purpose of, for example, automated driving in which the vehicle autonomatedly travels without depending on an operation of the driver.

Further, the microcomputer 12051 can output a control command to the body system control unit 12030 on the basis of the information on the outside of the vehicle acquired by the outside-vehicle information detection unit 12030. For example, the microcomputer 12051 can control headlamps according to a position of a preceding vehicle or an oncoming vehicle detected by the outside-vehicle information detection unit 12030 to thereby perform cooperative control for the purpose of antiglare, such as switching from a high beam to a low beam.

The audio and image output unit 12052 transmits an output signal of at least one of an audio and an image to an output device capable of notifying an occupant of the vehicle or the outside of the vehicle of information visually or audibly. In the example of FIG. 18, an audio speaker 12061, a display unit 12062, and an instrument panel 12063 are illustrated as examples of the output device. The display unit 12062 may include at least one of an on-board display and a head-up display, for example.

Figure 19:
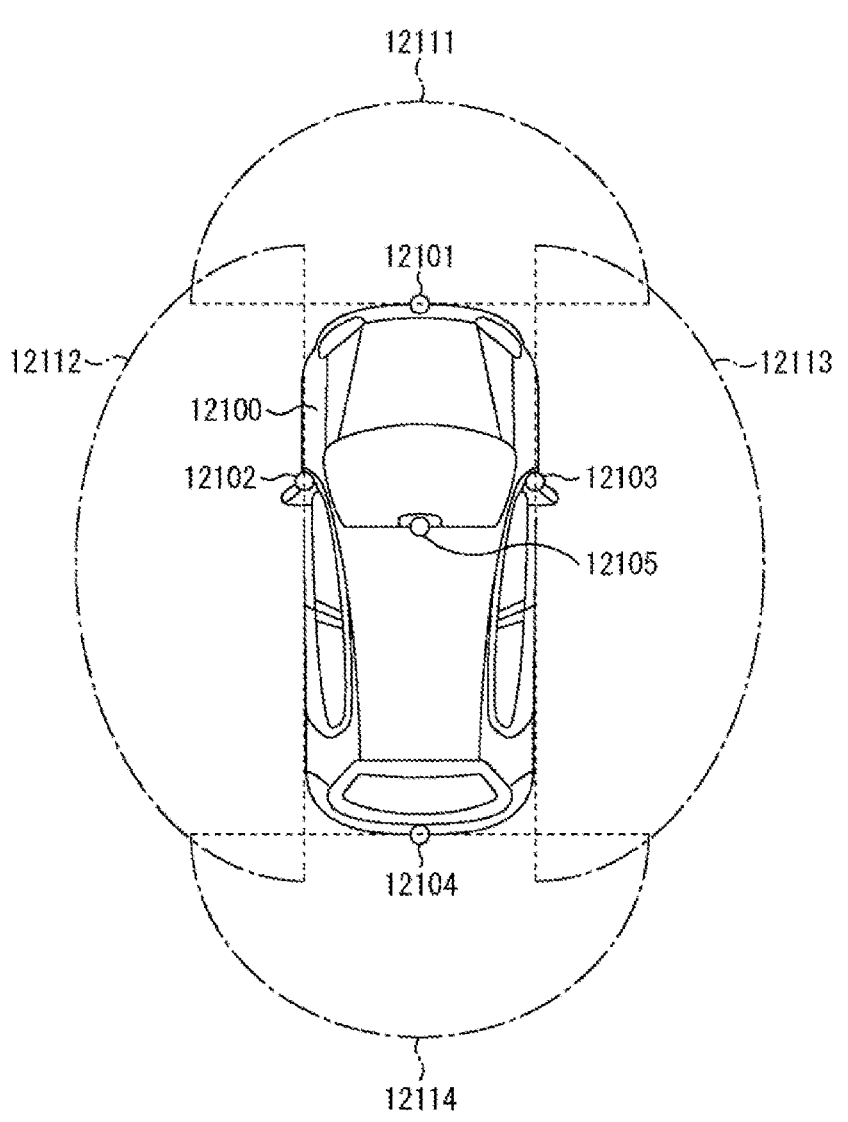
FIG. 19 is an illustrative diagram illustrating an example of installation positions of an outside-vehicle information detection unit and an imaging unit.

FIG. 19 is a diagram illustrating an example of an installation position of the imaging unit 12031.

In FIG. 19, the imaging unit 12031 includes imaging units 12101, 12102, 12103, 12104, and 12105.

The imaging units 12101, 12102, 12103, 12104, and 12105 are provided in positions such as a front nose, side mirrors, a rear bumper, and a back door of the vehicle 12100, and an upper portion of a windshield inside the vehicle. The imaging unit 12101 included in the front nose and the imaging unit 12105 included in the upper portion of the windshield inside the vehicle mainly acquire an image of an area in front of the vehicle 12100. The imaging units 12102 and 12103 included in the side mirrors mainly acquire images of areas on the sides of the vehicle 12100. The imaging unit 12104 included in the rear bumper or the back door mainly acquires an image of an area behind the vehicle 12100. The imaging unit 12105 included in the upper portion of the windshield inside the vehicle is mainly used for detection of a preceding vehicle, a pedestrian, an obstacle, a traffic signal, a traffic sign, a lane, or the like.

Examples of imaging ranges of the imaging units 12101 to 12104 are illustrated in FIG. 19. An imaging range 12111 indicates an imaging range of the imaging unit 12101 provided on the front nose, imaging ranges 12112 and 12113 indicate imaging ranges of the imaging units 12102 and 12103 provided in the side mirrors, and an imaging range 12114 indicates an imaging range of the imaging unit 12104 provided in the rear bumper or the back door. For example, a bird's-eye view image of the vehicle 12100 viewed from above can be obtained by overlaying image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements or may be an imaging element having pixels for phase difference detection.

For example, the microcomputer 12051 can obtain a distance to each three-dimensional object within the imaging ranges 12111 to 12114 and a temporal change in this distance (a relative speed with respect to the vehicle 12100) on the basis of the distance information obtained from the imaging units 12101 to 12104, to thereby extract, as the preceding vehicle, particularly, a closest three-dimensional object on a traveling path of the vehicle 12100, which is a three-dimensional object traveling in the substantially same direction as that of the vehicle 12100 at a predetermined speed (for example, 0 km/h or more). Further, the microcomputer 12051 can set an inter-vehicle distance to be secured in advance before the preceding vehicle and perform automatic braking control (including follow-up stop control), automatic acceleration control (including follow-up start control), and the like. Thus, it is possible to perform cooperative control for the purpose of, for example, automated driving in which the vehicle autonomatedly travels without depending on an operation of the driver.

For example, the microcomputer 12051 can classify three-dimensional object data regarding a three-dimensional object into other three-dimensional objects such as a two-wheeled vehicle, an ordinary vehicle, a large vehicle, a pedestrian, and a utility pole on the basis of the distance information obtained from the imaging units 12101 to 12104, extract the three-dimensional object data, and use the three-dimensional object data for automatic avoidance of obstacles. For example, the microcomputer 12051 identifies obstacles around the vehicle 12100 as obstacles visible to the driver of the vehicle 12100 and obstacles difficult to view. The microcomputer 12051 can determine a collision risk indicating a degree of risk of collision with each obstacle, and can output a warning to the driver via the audio speaker 12061 or the display unit 12062 or perform forced deceleration or avoidance steering via the drive system control unit 12010 when the collision risk is equal to or higher than a set value and collision is likely to occur, to thereby perform driving assistance for collision avoidance.

At least one of the imaging units 12101 to 12104 may be an infrared camera that detects infrared rays. For example, the microcomputer 12051 can determine whether or not a pedestrian is present in the captured images of the imaging units 12101 to 12104 to recognize the pedestrian. Such recognition of the pedestrian is performed using, for example, a procedure for extracting feature points in the captured images of the imaging units 12101 to 12104 serving as infrared cameras, and a procedure for performing pattern matching processing on a series of feature points indicating a contour of an object to determine whether the object is a pedestrian. When the microcomputer 12051 determines that the pedestrian is present in the captured images of the imaging units 12101 to 12104 and recognizes the pedestrian, the audio and image output unit 12052 controls the display unit 12062 so that the display unit 12062 displays the recognized pedestrian with a rectangular contour line for highlighting superimposed thereon. Further, the audio and image output unit 12052 may control the display unit 12062 so that the display unit 12062 displays, for example, an icon indicating a pedestrian in a desired position.

In the present specification, the system indicates the entire device configured of a plurality of devices.

The effects described in the present specification are merely examples and are not limited, and other effects may be obtained.

Embodiments of the present technology are not limited to the embodiments described above, and various modifications can be made without departing from the gist of the present technology.

The present technology can also be configured as follows.

(1) An imaging element including:

a first chip including a photodiode; and a second chip including a circuit configured to process a signal from the photodiode, the first and second chips being laminated, wherein an impurity layer is provided on a second surface opposite to a first surface of the second chip on which the first chip is laminated.

(2) The imaging element according to (1), wherein an impurity concentration of the impurity layer is higher than an impurity concentration of a semiconductor substrate constituting the second chip.

(3) The imaging element according to (1) or (2), wherein the impurity layer is a carrier of the same type as a carrier type of the second chip.

(4) The imaging element according to any one of (1) to (3), wherein the impurity layer is provided on a part or an entire surface of the second surface.

(5) The imaging element according to any one of (1) to (4), wherein the impurity layer is formed at a position away from the second surface of the second chip.

(6) The imaging element according to any one of (1) to (5), wherein the impurity layer is also provided on a side surface of the second chip.

(7) The imaging element according to any one of (1) to (6), wherein impurity layers with different characteristics are provided on the second surface.

(8) The imaging element according to any one of (1) to (7), wherein a thickness of the second chip is 20 μm or less.

(9) The imaging element according to any one of (1) to (8), wherein a third chip is further laminated on the second chip.

(10) The imaging element according to any one of (1) to (9), wherein two or more second chips are disposed with respect to the first chip.

(11) The imaging element according to (10), wherein the impurity layer having a different impurity concentration is provided in each of the two or more second chips.

(12) The imaging element according to (10), wherein the impurity layer having different carriers is provided in each of the two or more second chips.

(13) The imaging element according to any one of (1) to (12), wherein an impurity concentration of the second chip is 1E13 to E14/cm$^{-3}$, and an impurity concentration of the impurity layer is 1E16/cm$^{-3}$ or more.

(14) A semiconductor chip with a thickness of 20 μm or less, including: an impurity layer provided on a predetermined surface of the chip.

(15) The semiconductor chip according to (14), wherein a plurality of chips including the semiconductor chip are laminated, and an impurity layer is provided in at least one of the plurality of chips.

(16) The semiconductor chip according to (14) or (15), wherein the semiconductor chip is a chip having a memory or a logic circuit mounted thereon.

(17) An imaging element including:

a first chip including a photodiode;

a second chip including a circuit configured to process a signal from the photodiode; and a third chip having a memory function or an AI function, the first to third chips being laminated, wherein an impurity layer is provided on a second surface opposite to a first surface of the third chip on which the second chip is laminated.

(18) The imaging element according to (17), wherein an impurity layer is provided on a fourth surface opposite to a third surface of the second chip on which the first chip is laminated.

REFERENCE SIGNS LIST

10 Imaging device
11 Lens group
12 Imaging element
13 DSP circuit
14 Frame memory
15 Display unit
16 Recording unit
17 Operation system
18 Power supply system
19 Bus line
20 CPU
41 Pixel array unit
42 Vertical drive unit
43 Column processing unit
44 Horizontal drive unit
45 System control unit
46 Pixel drive line
47 Vertical signal line
48 Signal processing unit
49 Data storage unit
101 CIS chip
102 Logic chip
103 Support base
104 Gate formation layer
105 Source and drain formation layer
111 On-chip lens
112 Color filter
113 Photodiode
114 Wiring layer
115 Pad
121 Pad
122 Wiring
123 Transistor
130 High-concentration impurity layer
151 P-well
152 N-well
153 Diffusion layer
154 Diffusion layer
155 Element separation region
161 Depletion layer
162 Defect
201 Oxide film
251 Chip
252 High-concentration impurity layer
253 Oxide film
301 Laminated chip
311 Memory chip
330 High-concentration impurity layer
351 Monolithic device
401 Chip
402 Chip
403 Chip
404 Support base
412 Bump
414 Bump 501 Single-layer chip

What is claimed is:

1. An imaging element, comprising:
a first chip including a photodiode; and
a second chip including a circuit configured to process a signal from the photodiode, the first and second chips being laminated,
wherein an impurity layer is provided on a second surface opposite to a first surface of the second chip on which the first chip is laminated,
wherein two or more second chips are disposed with respect to the first chip, and
wherein at least two of the two or more second chips are arranged side by side in a horizontal direction and have different thicknesses.

2. The imaging element according to claim 1, wherein an impurity concentration of the impurity layer is higher than an impurity concentration of a semiconductor substrate constituting the second chip.

3. The imaging element according to claim 1, wherein the impurity layer is a carrier of the same type as a carrier type of the second chip.

4. The imaging element according to claim 1, wherein the impurity layer is provided on a part or all of the second surface.

5. The imaging element according to claim 1, wherein the impurity layer is formed at a position away from the second surface of the second chip.

6. The imaging element according to claim 1, wherein the impurity layer is also provided on a side surface of the second chip.

7. The imaging element according to claim 1, wherein impurity layers with different characteristics are provided on the second surface.

8. The imaging element according to claim 1, wherein a thickness of the second chip is 20 μm or less.

9. The imaging element according to claim 1, wherein a third chip is further laminated on the second chip.

10. The imaging element according to claim 1, wherein the impurity layer having a different impurity concentration is provided in each of the two or more second chips.

11. The imaging element according to claim 1, wherein the impurity layer having different carriers is provided in each of the two or more second chips.

12. The imaging element according to claim 1, wherein an impurity concentration of the second chip is 1E13 to E14/cm−3, and an impurity concentration of the impurity layer is 1E16/cm−3 or more.

13. The imaging element according to claim 1, wherein a vertical gap is provided between the at least two of the two or more second chips.

14. The imaging element according to claim 13, wherein an oxide film is provided within the gap.

15. The imaging element according to claim 14, wherein the impurity layer is provided within a portion of the gap.

* * * * *